United States Patent
Chen et al.

(10) Patent No.: US 11,626,156 B2
(45) Date of Patent: Apr. 11, 2023

(54) COMPUTE-IN-MEMORY (CIM) BIT CELL CIRCUITS EACH DISPOSED IN AN ORIENTATION OF A CIM BIT CELL CIRCUIT LAYOUT INCLUDING A READ WORD LINE (RWL) CIRCUIT IN A CIM BIT CELL ARRAY CIRCUIT

(71) Applicant: QUALCOMM Incorporated, San Diego, CA (US)

(72) Inventors: Xiaonan Chen, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 17/404,378

(22) Filed: Aug. 17, 2021

(65) Prior Publication Data

US 2022/0172770 A1    Jun. 2, 2022

Related U.S. Application Data

(60) Provisional application No. 63/120,582, filed on Dec. 2, 2020.

(51) Int. Cl.
*G11C 7/12* (2006.01)
*G11C 11/413* (2006.01)
(Continued)

(52) U.S. Cl.
CPC .......... *G11C 11/413* (2013.01); *G11C 7/1006* (2013.01); *G11C 11/419* (2013.01); *G11C 11/54* (2013.01)

(58) Field of Classification Search
CPC ... G11C 11/413; G11C 7/1006; G11C 11/419; G11C 11/54; H03K 19/01742; H03K 19/20
See application file for complete search history.

(56) References Cited

U.S. PATENT DOCUMENTS 11,024,358 B1 * 6/2021 Srivastava .......... G11C 7/1006
2014/0003133 A1 * 1/2014 Lin ..................... H01L 27/1104
716/55
(Continued)

FOREIGN PATENT DOCUMENTS

WO       2019246064 A1    12/2019
WO    WO-2019246064 A1 *  12/2019    ......... G06F 12/0207

OTHER PUBLICATIONS

International Search Report and Written Opinion for International Patent Application No. PCT/US2021/052871, dated Jan. 24, 2022, 15 pages.

*Primary Examiner* — Mushfique Siddique
(74) *Attorney, Agent, or Firm* — Qualcomm Incorporated

(57) ABSTRACT

Compute-in-memory (CIM) bit cell array circuits include CIM bit cell circuits for multiply-accumulate operations. The CIM bit cell circuits include a memory bit cell circuit for storing a weight data in true and complement form. The CIM bit cell circuits include a true pass-gate circuit and a complement pass-gate circuit for generating a binary product of the weight data and an activation input on a product node. An RWL circuit couples the product node to a ground voltage for initialization. The CIM bit cell circuits also include a plurality of consecutive gates each coupled to at least one of the memory bit cell circuit, the true pass-gate circuit, the complement pass-gate circuit, and the RWL circuit. Each of the CIM bit cell circuits in the CIM bit cell array circuit is disposed in an orientation of a CIM bit cell circuit layout including the RWL circuit.

19 Claims, 14 Drawing Sheets

(51) Int. Cl.
*G11C 11/54* (2006.01)
*G11C 7/10* (2006.01)
*G11C 11/419* (2006.01)

(56) References Cited

U.S. PATENT DOCUMENTS

| | | |
|---|---|---|
| 2014/0075087 A1* | 3/2014 | Bartling .............. G06F 12/0238 711/102 |
| 2014/0211546 A1* | 7/2014 | Jung .................... G11C 11/412 29/25.01 |
| 2019/0080231 A1 | 3/2019 | Nestler et al. |
| 2021/0005230 A1* | 1/2021 | Wang .................... G11C 7/065 |
| 2021/0279039 A1* | 9/2021 | Srivastava ................ G06F 7/57 |
| 2021/0349689 A1* | 11/2021 | Lu ........................... G11C 11/54 |

* cited by examiner

| INPUT X | INPUT W | XNOR OUTPUT |
|---|---|---|
| 0 | 0 | 1 |
| 0 | 1 | 0 |
| 1 | 0 | 0 |
| 1 | 1 | 1 |

COMPUTE-IN-MEMORY (CIM) BIT CELL CIRCUITS EACH DISPOSED IN AN ORIENTATION OF A CIM BIT CELL CIRCUIT LAYOUT INCLUDING A READ WORD LINE (RWL) CIRCUIT IN A CIM BIT CELL ARRAY CIRCUIT

PRIORITY APPLICATION

The present application claims priority under 35 U.S.C. § 119(e) to U.S. Provisional Patent Application Ser. No. 63/120,582, filed Dec. 2, 2020 and entitled "COMPUTE-IN-MEMORY (CIM) BIT CELL CIRCUITS EACH DISPOSED IN AN ORIENTATION OF A CIM BIT CELL CIRCUIT LAYOUT INCLUDING A READ WORD LINE (RWL) CIRCUIT IN A CIM BIT CELL ARRAY CIRCUIT," which is incorporated herein by reference in its entirety.

BACKGROUND

I. Field of the Disclosure

The field of the disclosure relates generally to compute-in-memory (CIM) arrays used in circuits for high-speed parallel data processing, such as neural networks.

II. Background

Machine learning is an example of artificial intelligence (AI) that can be employed to improve performance of some applications in a processing device. A neural network is one type of processor configuration in which an application can learn by evaluating input data based on historical information, receiving feedback on the accuracy of the evaluation, and adjusting the historical information accordingly. The operations of a neural network implementing machine learning are performed by arrays of nodes that each resemble a brain synapse. Each node performs a multiply-accumulate (MAC) operation in which each input in a set of inputs is multiplied by a weight data in a multiplication operation and the products representing the weighted inputs are summed together. Each evaluation can include thousands of calculations. Initial weight data is modified based on feedback to increase accuracy of an application.

FIG. 1 is an illustration of a node 100 of a neural network configured to perform a MAC operation. The node 100 receives a set of inputs $X_0$-$X_M$ that are each multiplied by a corresponding one of weight values $W_0$-$W_M$. The weight values $W_0$-$W_M$ are based on feedback from previous calculations and are updated to improve the accuracy of calculations regarding a particular type of input data over time. The products $P_0$-$P_M$ of the multiplications are accumulated (e.g., added) in an accumulation function Σ to generate a sum SUM, and the node 100 generates an output OUT that is a function AF (e.g., activation function) of the sum SUM.

In a compute-in-memory (CIM) array, the input data and weight data may each be represented by a bit of binary data. Each bit cell of the array includes a memory bit cell for storing the weight data and a multiplication circuit. A multiplication of two one-bit binary data values in a CIM bit cell may be implemented as a logical AND-based operation (e.g., AND or Not AND (NAND)) or as a logical OR-based operation (e.g., OR, Not OR (NOR), or not exclusive-OR (XNOR)). FIG. 2 is a truth table illustrating a multiplication of a received input X and input W to produce an XNOR output in a CIM bit cell circuit. The input X is an activation input and the input W is a stored weight data. A CIM array bit cell circuit that executes MAC instructions in a processing circuit improves performance in machine learning applications but occupies a large area of an integrated circuit (IC). The layout of CIM bit cell circuits in a CIM array determines both the total area occupied by the CIM array and the uniformity of operation of the respective CIM bit cell circuits.

SUMMARY OF THE DISCLOSURE

Aspects disclosed herein include compute-in-memory (CIM) bit cell circuits each disposed in an orientation of a CIM bit cell circuit layout including a read word line (RWL) circuit in a CIM bit cell array circuit. Related methods are also disclosed. An exemplary CIM bit cell array circuit ("CIM array circuit") includes exemplary CIM bit cell circuits to execute a multiply-accumulate (MAC) operation. The CIM bit cell circuits include a memory bit cell circuit for storing a weight data in true and complement form. The CIM bit cell circuits also include a true pass-gate circuit and a complement pass-gate circuit for generating a product of the weight data and an activation input on a product node. In an example, the product is a not exclusive-OR (XNOR) of the true weight data and the activation input. The CIM bit cell circuits also include an RWL circuit coupled to the product node and a ground voltage rail for initializing the product data. The CIM bit cell circuits also include a plurality of gates that extend in a first axis direction and are separated from each other in a second axis direction orthogonal to the first axis direction. The plurality of gates includes consecutive gates in the second axis direction and each of the consecutive gates is coupled to at least one of the memory bit cell circuit, the true pass-gate circuit, the complement pass-gate circuit, and the RWL circuit. In a CIM array circuit in which the individual CIM bit cell circuits include the RWL circuit and are disposed in orientations of an exemplary CIM bit cell circuit layout, the respective CIM bit cell circuits operate with increased uniformity, which improves performance and reliability of the CIM array circuit.

In an exemplary aspect, a CIM bit cell circuit including a memory bit cell circuit, a true pass-gate circuit, a complement pass-gate circuit, and an RWL circuit is disclosed. The memory bit cell circuit comprises a true pull-up transistor coupled to a supply voltage rail and a true output node and a true pull-down transistor coupled to the true output node and a ground voltage rail. The memory bit cell circuit comprises a complement pull-up transistor coupled to the supply voltage rail and a complement output node and a complement pull-down transistor coupled to the complement output node and the ground voltage rail. The true pass-gate circuit comprises a first true transistor coupled to the true output node and a product node and a second true transistor coupled to the true output node and the product node. The complement pass-gate circuit comprises a first complement transistor coupled to the complement output node and the product node and second complement transistor coupled to the complement output node and the product node. The RWL circuit comprises an RWL transistor coupled to the ground voltage rail and the product node. The CIM bit cell circuit also includes a plurality of gates extending in a first axis direction and separated from each other in a second axis direction orthogonal to the first axis direction, wherein the plurality of gates comprises consecutive gates in the second axis direction, each of the consecutive gates coupled to at least one of the memory bit cell circuit, the true pass-gate circuit, the complement pass-gate circuit, and the RWL circuit.

In another exemplary aspect, a CIM bit cell circuit including a semiconductor substrate, a P-type diffusion region in the semiconductor substrate, and an N-type diffusion region in the semiconductor substrate is disclosed. The CIM bit cell circuit includes a memory bit cell circuit, a true pass-gate circuit, a complement pass-gate circuit, and an RWL transistor. The memory bit cell circuit comprises a true pull-up transistor coupled to a supply voltage rail and a true output node and a true pull-down transistor coupled to the true output node and a ground voltage rail. The memory bit cell circuit comprises a complement pull-up transistor coupled to the supply voltage rail and a complement output node and a complement pull-down transistor coupled to the complement output node and the ground voltage rail. The true pass-gate circuit comprises a first true transistor coupled to the true output node and a product node and a second true transistor coupled to the true output node and the product node. The complement pass-gate circuit comprises a first complement transistor coupled to the complement output node and the product node and second complement transistor coupled to the complement output node and the product node. The RWL transistor is coupled to the ground voltage rail and the product node. The true pull-down transistor, the complement pull-down transistor, the first true transistor, the first complement transistor, and the RWL transistor each comprise a portion of the N-type diffusion region.

In another exemplary aspect, a CIM bit cell array circuit including a semiconductor substrate and a plurality of CIM bit cell circuits on the semiconductor substrate is disclosed. Each of the plurality of CIM bit cell circuits comprises a P-type diffusion region disposed in the semiconductor substrate and an N-type diffusion region disposed in the semiconductor substrate. Each of the plurality of CIM bit cell circuits further comprises a memory bit cell circuit, a true pass-gate circuit, a complement pass-gate circuit, an RWL circuit, and a plurality of gates. The memory bit cell circuit comprises a true pull-up transistor coupled to a supply voltage rail and a true output node and a true pull-down transistor coupled to the true output node and a ground voltage rail. The memory bit cell circuit comprises a complement pull-up transistor coupled to the supply voltage rail and a complement output node and a complement pull-down transistor coupled to the complement output node and the ground voltage rail. The true pass-gate circuit comprises a first true transistor coupled to the true output node and a product node and a second true transistor coupled to the true output node and the product node. The complement pass-gate circuit comprises a first complement transistor coupled to the complement output node and the product node and second complement transistor coupled to the complement output node and the product node. The RWL circuit comprises an RWL transistor coupled to the ground voltage rail and the product node. The plurality of gates extends in a first axis direction and are separated from each other in a second axis direction orthogonal to the first axis direction, wherein each of the memory bit cell circuit, the true pass-gate circuit, and the complement pass-gate circuit comprises at least one transistor disposed in the P-type diffusion region and at least one transistor disposed in the N-type diffusion region, and the plurality of gates comprises consecutive gates in the second axis direction, each of the consecutive gates coupled to at least one of the memory bit cell circuit, the true pass-gate circuit, the complement pass-gate circuit, and the RWL circuit.

In another exemplary aspect, a method of fabricating a CIM bit cell array circuit comprising a plurality of CIM bit cell circuits on a semiconductor substrate is disclosed. The method comprises forming a P-type diffusion region and an N-type diffusion region in the semiconductor substrate. The method comprises forming a memory bit cell circuit comprising a true pull-up transistor coupled to a supply voltage rail and a true output node, a true pull-down transistor coupled to the true output node and a ground voltage rail, a complement pull-up transistor coupled to the supply voltage rail and a complement output node, and a complement pull-down transistor coupled to the complement output node and the ground voltage rail. The method comprises forming a true pass-gate circuit comprising a first true transistor coupled to the true output node and a product node, and a second true transistor coupled to the true output node and the product node. The method comprises forming a complement pass-gate circuit comprising a first complement transistor coupled to the complement output node and the product node, and a second complement transistor coupled to the complement output node and the product node. The method comprises forming an RWL circuit comprising an RWL transistor coupled to the ground voltage rail and the product node and forming a plurality of gates extending in a first axis direction and separated from each other in a second axis direction orthogonal to the first axis direction, wherein the plurality of gates comprises consecutive gates in the second axis direction, and each of the consecutive gates is coupled to at least one of the memory bit cell circuit, the true pass-gate circuit, the complement pass-gate circuit, and the RWL circuit.

BRIEF DESCRIPTION OF THE FIGURES

FIG. 2 is a truth table illustrating binary products generated in a not exclusive-OR (XNOR) operation for each combination of values of two binary inputs;

DETAILED DESCRIPTION

Figure 1:
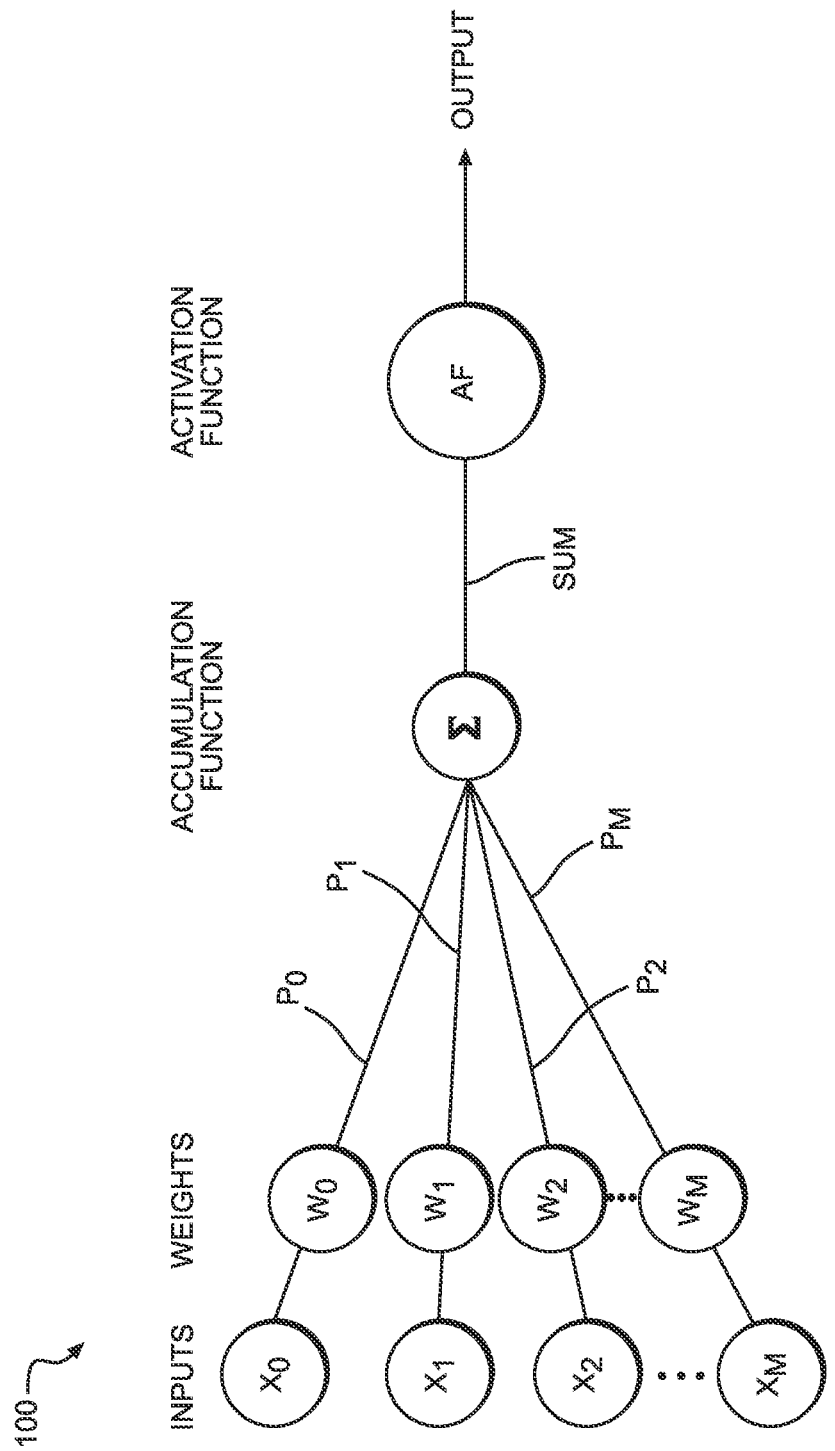
FIG. 1 is a block diagram of a neural network node for performing a multiply-accumulate (MAC) operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include compute-in-memory (CIM) bit cell circuits each disposed in an orientation of a CIM bit cell circuit layout including a read word line (RWL) circuit in a CIM bit cell array circuit. Related methods are also disclosed. An exemplary CIM bit cell array circuit ("CIM array circuit") includes exemplary CIM bit cell circuits to execute a multiply-accumulate (MAC) operation. The CIM bit cell circuits include a memory bit cell circuit for storing a weight data in true and complement form. The CIM bit cell circuits also include a true pass-gate circuit and a complement pass-gate circuit for generating a product of the weight data and an activation input on a product node. In an example, the product is a not exclusive-OR (XNOR) of the true weight data and the activation input. The CIM bit cell circuits also include an RWL circuit coupled to the product node and a ground voltage rail for initializing the product data. The CIM bit cell circuits also include a plurality of gates that extend in a first axis direction and are separated from each other in a second axis direction orthogonal to the first axis direction. The plurality of gates includes consecutive gates in the second axis direction and each of the consecutive gates is coupled to at least one of the memory bit cell circuit, the true pass-gate circuit, the complement pass-gate circuit, and the RWL circuit. In a CIM array circuit in which the individual CIM bit cell circuits include the RWL circuit and are disposed in orientations of an exemplary CIM bit cell circuit layout, the respective CIM bit cell circuits operate with increased uniformity, which improves performance and reliability of the CIM array circuit.

Figure 3:
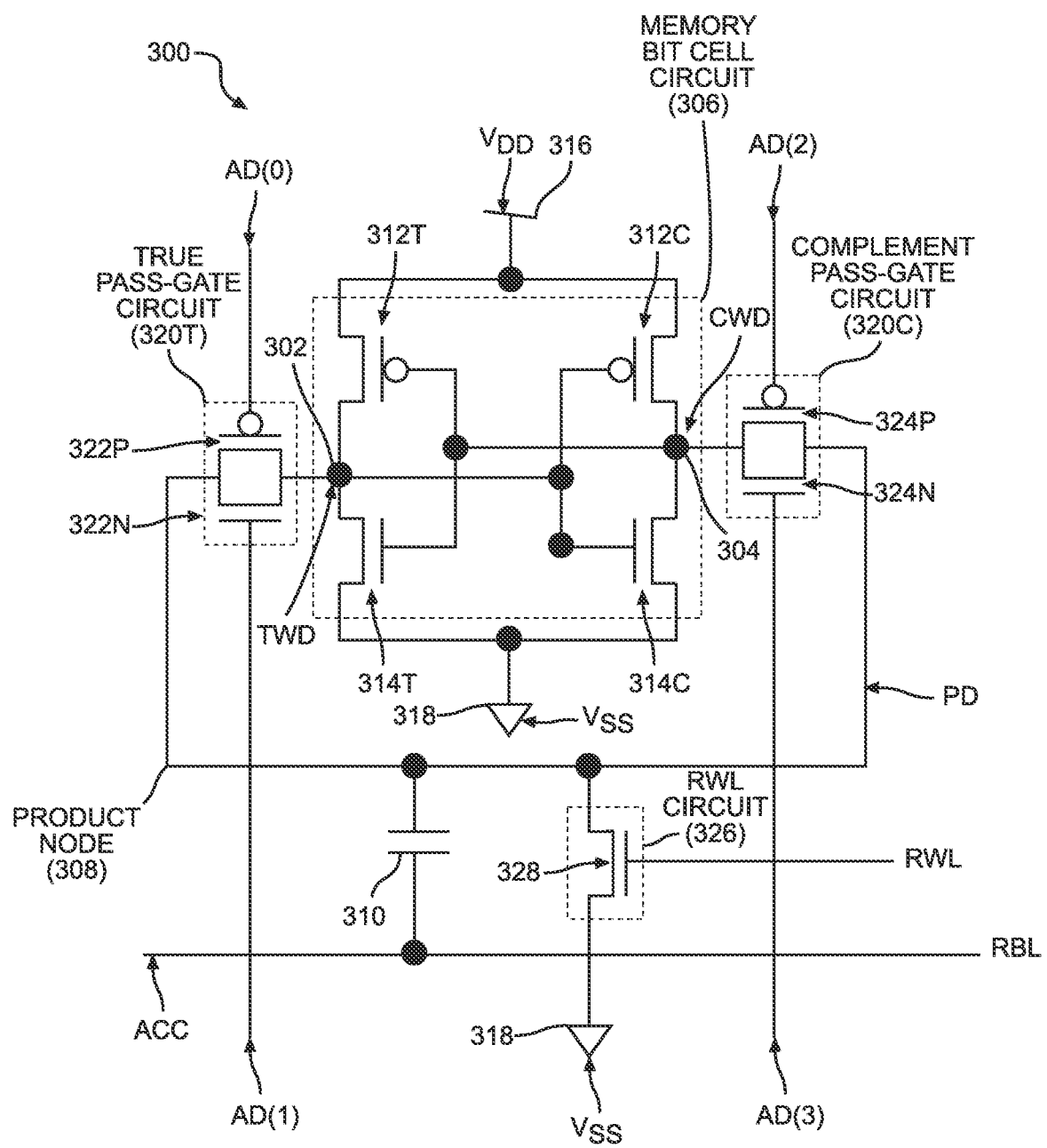
FIG. 3 is a schematic diagram of a compute-in-memory (CIM) bit cell circuit for a CIM array circuit that can execute a MAC operation.

FIG. 3 is a schematic diagram illustrating a CIM bit cell circuit 300 that executes a binary multiply operation of a true weight data TWD and activation data AD. The activation data AD is used to generate activation data AD(0)-AD(3), which are each provided to the CIM bit cell circuit 300. In response to the activation data AD(0)-AD(3), a binary multiply for a MAC operation is executed by the CIM bit cell circuit 300 and a product data PD is provided to a read bit line RBL. A plurality of the CIM bit cell circuits 300 (not shown) generate the product data PD that are accumulated on the read bit line RBL as an accumulated result ACC. Increasing uniformity in operation of the respective CIM bit cell circuits 300 increases reliability and performance of the MAC operation.

The multiply operation within each CIM bit cell circuit 300 is a Boolean XNOR operation of the true weight data TWD and the activation data AD. The CIM bit cell circuit 300 stores the true weight data TWD at a true output node 302 and stores a complement weight data CWD at a complement output node 304 of a memory bit cell circuit 306. The CIM bit cell circuits 300 generate the product data PD on a product node 308 that is coupled (e.g., capacitively coupled) to the read bit line RBL by a capacitor 310 in response to the activation data AD.

As noted, the CIM bit cell circuit 300 stores the true weight data TWD in the memory bit cell circuit 306. The memory bit cell circuit 306 includes a true pull-up transistor 312T, a true pull-down transistor 314T, a complement pull-up transistor 312C, and a complement pull-down transistor 314C in a cross-coupled configuration. In the example of the CIM bit cell circuit 300 in FIG. 3, each of the transistors 312T, 312C, 314T, and 314C are metal-oxide semiconductor (MOS) field effect transistors (FETs) (MOSFETs). However, the CIM bit cell circuit 300 is not limited in this regard.

The true pull-up transistor 312T is coupled to a supply voltage rail 316. In this context, and unless specified otherwise, coupling the true pull-up transistor 312T to the supply voltage rail 316 refers to providing an electrical connection or path by way of one or more electrical conductors. By way of such coupling, the true pull-up transistor 312T receives a supply voltage $V_{DD}$. In this regard, the true pull-up transistor 312T is also coupled to the true output node 302. The true pull-down transistor 314T is coupled to the true output node 302 and also to a ground voltage rail 318, which receives a ground voltage $V_{SS}$. The complement pull-up transistor 312C is coupled to the supply voltage rail 316 and also to the complement output node 304. The complement pull-down transistor 314C is coupled to the complement output node 304 and to the ground voltage rail 318. The true pull-up transistor 312T and the true pull-down transistor 314T are controlled by the complement output node 304, and the complement pull-up transistor 312C and the complement pull-down transistor 314C are controlled by the true output node 302.

The product data PD is generated on the product node 308 by a true pass-gate circuit 320T coupled to the true output node 302 and a complement pass-gate circuit 320C coupled to the complement output node 304. The true pass-gate circuit 320T includes a first true transistor 322P and a second true transistor 322N, both of which are coupled to the true output node 302 and to the product node 308. The complement pass-gate circuit 320C includes a first complement transistor 324P and a second complement transistor 324N, both of which are coupled to the complement output node 304 and to the product node 308. The first true transistor 322P, the second true transistor 322N, the first complement transistor 324P, and the second complement transistor 324N are controlled by the activation data AD(0:3), which are each true or complement versions of the activation data AD being multiplied by the true weight data TWD. In this manner, the true pass-gate circuit 320T and the complement pass-gate circuit 320C generate a product data PD of the XNOR operation on the product node 308.

Figure 2:
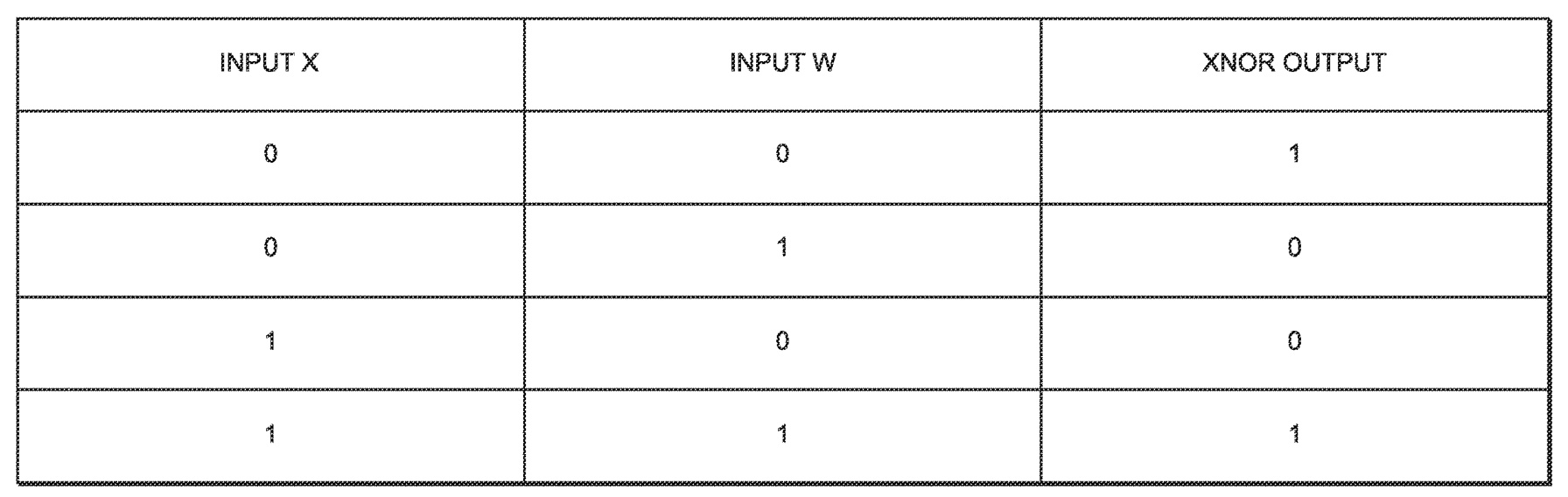

The activation data AD is provided as a single bit binary value where a binary "1" corresponds to a positive voltage (e.g., 2 volts (V)) and a binary "0" corresponds to ground (e.g., 0 V). The activation data AD is provided in true form as AD(0) and AD(3) and provided in complement form as AD(1) and AD(2). As an example, in the case of the activation data AD being a binary "1", the AD(0) and AD(3) are binary "0" and the AD(1) and AD(2) are binary "1". In response to the AD(0) being "0" and the AD(1) being "1", the true weight data TWD is passed by the true pass-gate circuit 320T to the product node 308. In case the activation data AD is a binary "0", the complement weight data CWD is passed by the complement pass-gate circuit 320C to the product node 308. In this regard, the product data PD generated in the CIM bit cell circuit 300 corresponds to the truth table of an XNOR operation in FIG. 2 with the inputs being the activation data AD and the true weight data TWD.

As noted above, the capacitor 310 couples the product node 308 to the read bit line RBL. In the context of the capacitor 310, coupling refers to capacitive coupling rather than providing an electrical connection. The product node 308 is also coupled (e.g., by electrical connection over a conductive path) to the ground voltage rail 318 by an RWL circuit 326 that includes an RWL transistor 328. The true weight data TWD is reset/initialized to a known state in response to the read word line RWL being activated in combination with the activation data AD controlling the true and complement pass-gate circuits 320T and 320C.

Figure 4A:
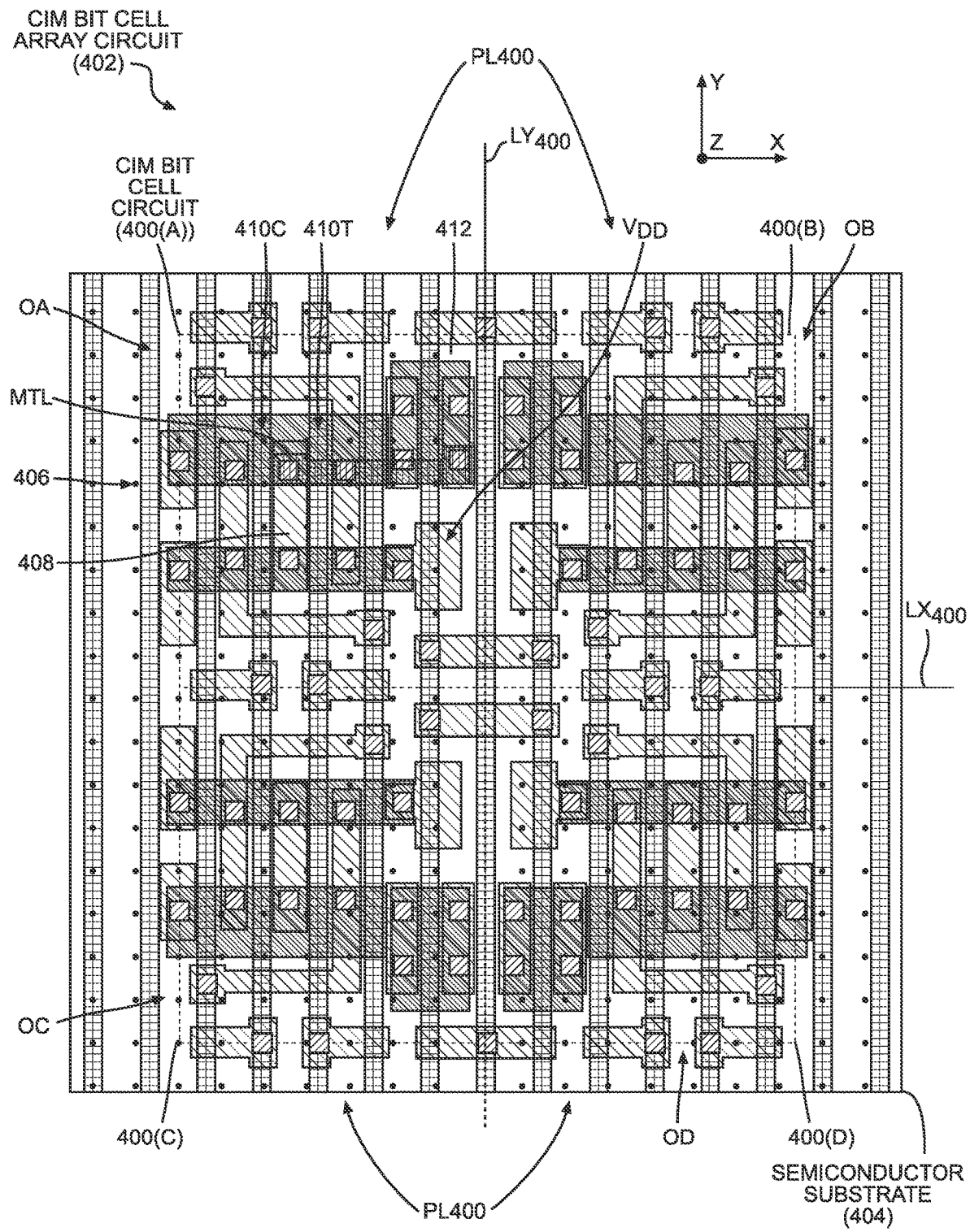
FIG. 4A is a top view of four exemplary CIM bit cell circuits as illustrated in FIG. 3, each CIM bit cell circuit in a respective orientation of a CIM bit cell circuit layout that includes a read word line (RWL) transistor to minimize performance variations.

FIG. 4A is a top plan view of exemplary CIM bit cell circuits 400(A)-400(D) corresponding to the CIM bit cell circuit 300 illustrated in FIG. 3. The CIM bit cell circuits 400(A)-400(D) are disposed in a CIM bit cell array circuit 402 on a semiconductor substrate 404. The CIM bit cell array circuit 402 is also referred to herein as a "CIM array 402". The CIM bit cell circuits 400(A)-400(D) are disposed in respective orientations OA, OB, OC, and OD of a CIM bit cell circuit layout $PL_{400}$ ("CIM cell layout $PL_{400}$"). Each of the CIM bit cell circuits 400(A)-400(D) includes an memory bit cell circuit 406, corresponding to the memory bit cell circuit 306 in FIG. 3, and a product node 408, corresponding to the product node 308. The CIM bit cell circuits 400(A)-400(D) also include a true pass-gate circuit 410T and a complement pass-gate circuit 410C, corresponding to the true and complement pass-gate circuits 320T and 320C in FIG. 3. Each of the CIM bit cell circuits 400(A)-400(D) also includes an RWL circuit 412, corresponding to the RWL circuit 326 in FIG. 3.

The orientations OA-OD of the CIM bit cell circuits 400(A)-400(D) are based on the CIM cell layout $PL_{400}$ being flipped with respect to either the X-axis direction or the Y-axis direction, such that relative positions of features of the memory bit cell circuit 406, the true pass-gate circuit 410T, the complement pass-gate circuit 410C, and the RWL circuit 412 remain consistent among the different orientations OA-OD with respect to distances and relative locations. For example, the orientation OA of the CIM bit cell circuit 400(A) mirrors the orientation OB of the CIM bit cell circuit 400(B) on an opposite side of a line $LY_{400}$ in the Y-axis direction. Stated differently, the orientation OB corresponds to the orientation OA being flipped over (e.g., like turning a page) across the line $LY_{400}$ in the Y-axis direction, which makes the features in the orientation OA symmetric to the features in the orientation OB with respect to the line $LY_{400}$. Similarly, the orientation OA of the CIM bit cell circuit 400(A) mirrors the orientation OC of the CIM bit cell circuit 400(C) with respect to a line $LX_{400}$ in the X-axis direction and the orientation OD is a mirror image of the orientation OB with respect to the line $LX_{400}$. Thus, the RWL circuit 412 is in the same relative position in all orientations OA-OD.

Figure 4B:
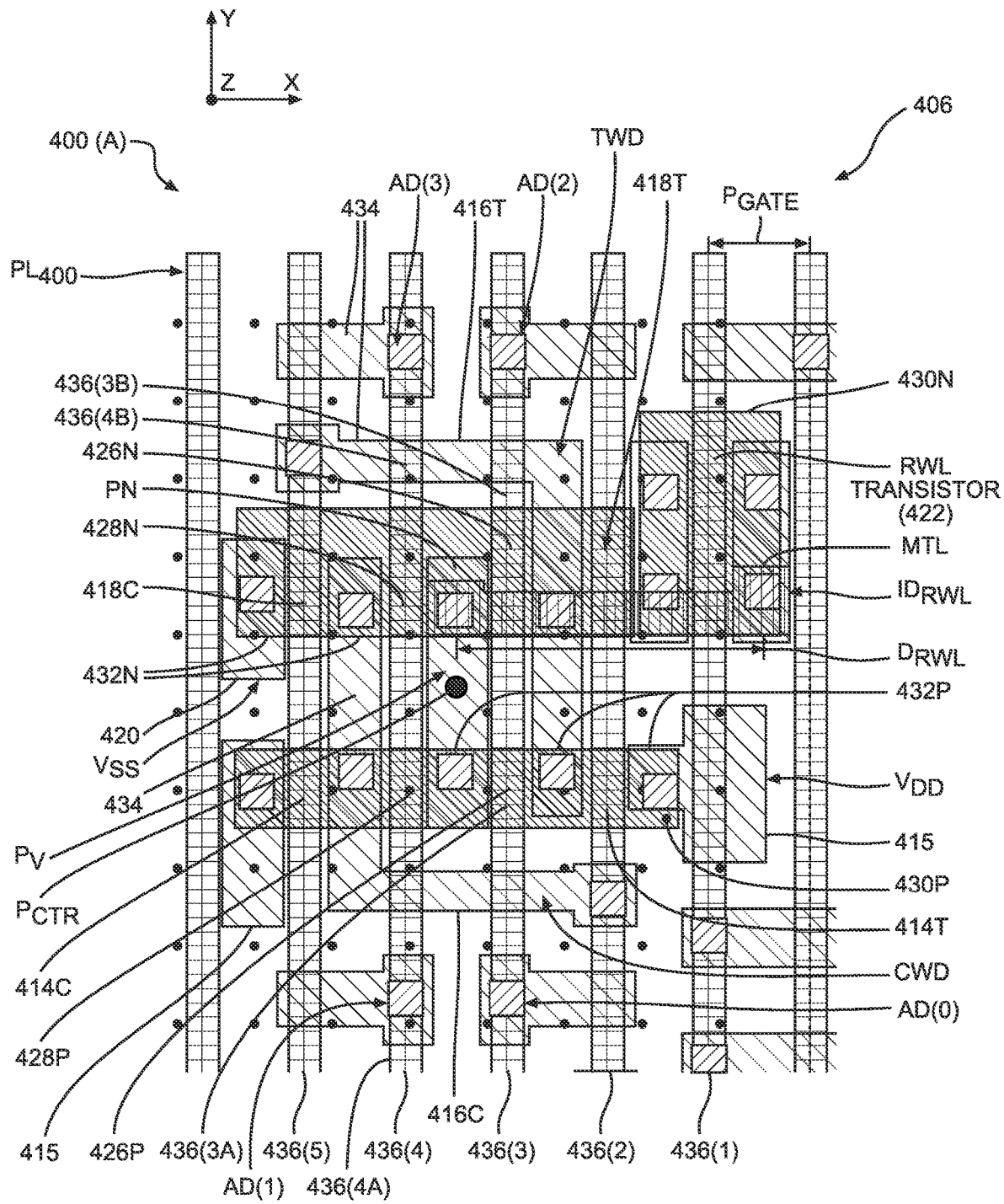
FIG. 4B is a top view of a CIM bit cell circuit in one of the orientations of a CIM bit cell circuit layout in FIG. 4A.

In view of the similarity of the respective orientations OA-OD, the features of the CIM bit cell circuits 400(A)-400(D) are described with reference to the CIM bit cell circuit 400(A) in orientation OA of FIG. 4A as illustrated in FIG. 4B. The memory bit cell circuit 406 includes a true pull-up transistor 414T coupled to a supply voltage node 415 and to a true output node 416T. The memory bit cell circuit 406 includes a true pull-down transistor 418T coupled to the true output node 416T and to a ground voltage node 420. The memory bit cell circuit 406 includes a complement pull-up transistor 414C coupled to a supply voltage node 415 and to a complement output node 416C. The memory bit cell circuit 406 also includes a complement pull-down transistor 418C coupled to a ground voltage node 420. The memory bit cell circuit 406 stores a true weight data TWD at the true output node 416T and stores a complement weight data CWD at the complement output node 416C. The supply voltage nodes 415 receive the supply voltage $V_{DD}$ from a supply voltage rail (not shown). The ground voltage nodes 420 receive the ground voltage $V_{SS}$ from a ground voltage rail (not shown).

The true pass-gate circuit 410T (see FIG. 4A) includes a first true transistor 426P and a second true transistor 426N that are both coupled to the true output node 416T and a product node PN. The complement pass-gate circuit 410C includes a first complement transistor 428P and a second complement transistor 428N that are both coupled to the complement output node 416C and to the product node PN. The RWL circuit 412 (see FIG. 4A) includes an RWL transistor 422 coupled to the ground voltage node 420 and the product node PN. The RWL transistor 422 is coupled to the product node PN in each of the CIM bit cell circuits 400(A)-400(D) by a metal trace MTL (e.g., in a second metal layer), which couples the RWL transistor 422 to a central point $P_{CTR}$ of the product node PN. The metal trace MTL is shown only in the CIM bit cell circuit 400(A).

The first true transistor 426P and the second true transistor 426N couple the true output node 416T to the product node PN based on an activation data AD, which is a single binary data bit. The activation data AD is provided in true and complement forms as AD(0)-AD(3) and is hereinafter referred to as AD(0)-AD(3). In the example in FIG. 4B, the first true transistor 426P and the second true transistor 426N are different types of transistors (e.g., P-type FET (PFET) and N-type FET (NFET), respectively) and receive the activation data AD(0) and AD(1), respectively, which are of opposite polarities, such that the true output node 416T is coupled to the product node PN based on the activation data AD(0) being a first polarity and the activation data AD(1) being a second polarity. The first complement transistor 428P and the second complement transistor 428N also couple the complement output node 416C to the product node PN based on the activation data AD(2) and AD(3). In the example, the first complement transistor 428P and the second complement transistor 428N are also different types of transistors and receive the activation data AD(2) and AD(3) which cause the complement output node 416C to be coupled to the product node PN based on the activation data AD(2) being a first polarity and AD(3) being a second polarity. As a result of such configuration, a product voltage PV supplied to the product node PN by the true and complement pass-gate circuits 410T and 410C (see FIG. 4A) corresponds to an XNOR of the true weight data TWD and the activation data AD.

With further reference to FIG. 4B, the CIM cell layout $PL_{400}$ includes a P-type diffusion region 430P and an N-type diffusion region 430N. The P-type diffusion region 430P is an uninterrupted area of the semiconductor substrate 404 (see FIG. 4A) that is continuously doped with a trivalent impurity (e.g., boron, gallium, indium, etc.), and the N-type diffusion region 430N is an uninterrupted area of the semiconductor substrate 404 that is continuously doped with a pentavalent impurity (e.g., phosphorous, arsenic, antimony, etc.). In the example in FIG. 4B, the true pull-up transistor 414T, the complement pull-up transistor 414C, the first true transistor 426P, and the first complement transistor 428P are all PFETs disposed in the P-type diffusion region 430P. Thus, the true pull-up transistor 414T, the complement pull-up transistor 414C, the first true transistor 426P, and the first complement transistor 428P include respective portions 432P of the P-type diffusion region 430P.

Similarly, in the example in FIG. 4B, the true pull-down transistor 418T, the complement pull-down transistor 418C, the second complement transistor 426N, the second complement transistor 428N, and the RWL transistor 422 are all NFETs disposed in the N-type diffusion region 430N and include respective portions 432N of the N-type diffusion region 430N.

FIG. 4B also shows metal traces 434 (e.g., in a first metal level) interconnecting the respective transistors of the memory bit cell circuit 406, the true pass-gate circuit 410T, the complement pass-gate circuit 410C, and the RWL transistor 422. FIG. 4B also shows gates 436(1)-436(5) extending in the Y-axis direction in CIM bit cell circuit 400(A). The gates 436(1)-436(5) are separated from each other according to a gate pitch $P_{GATE}$ measured from center to center of the gates 436(1)-436(5) in the X-axis direction. The X-axis direction is orthogonal to the Y-axis direction.

Within the CIM cell layout $PL_{400}$, the gates 436(1)-436(5) are five (5) consecutive gates (i.e., consecutive in the X-axis direction). Each of the consecutive gates 436(1)-436(5) is coupled to at least one transistor in each of the memory bit cell circuit 406, the true pass-gate circuit 410T, the complement pass-gate circuit 410C, and the RWL circuit 412. In other words, each of the consecutive gates 436(1)-436(5) is coupled to and controls at least one of the true pull-up transistor 414T, the true pull-down transistor 418T, the complement pull-up transistor 414C, the complement pull-down transistor 418C, the first true transistor 426P, the second true transistor 426N, the first complement transistor 428P, the second complement transistor 428N, and the RWL transistor 422.

Specifically, the gate 436(1) is coupled to the RWL transistor 422 in CIM bit cell circuit 400(A) and a next one (i.e., gate 436(2)) of the consecutive gates 436(1)-436(5) is coupled to the true pull-up transistor 414T and the true pull-down transistor 418T. The gate 436(3) is coupled to both the first true transistor 426P and the second true transistor 426N of the true pass-gate circuit 410T. However, the gate 436(3) is electrically split into a first portion 436(3A) coupled to the first true transistor 426P and a second portion 436(3B) coupled to the second true transistor 426N. The first true transistor 426P and the second true transistor 426N are activated in unison in the true pass-gate circuit 410T with opposite voltage polarities on the first and second portions 436(3A) and 436(3B).

The gate 436(4) is coupled to the first complement transistor 428P and the second complement transistor 428N of the complement pass-gate circuit 410C. The gate 436(4) is electrically split into a first portion 436(4A) coupled to the first complement transistor 428P and a second portion 436(4B) coupled to the second complement transistor 428N. The first complement transistor 428P and the second complement transistor 428N are activated in unison with opposite voltage polarities on the first and second portions 436(4A) and 436(4B). The gate 436(5) is coupled to the complement pull-up transistor 414C and the complement pull-down transistor 418C.

As noted above, the RWL transistor 422 is a distance $D_{RWL}$ from a central point $P_{CTR}$ of the product node PN and the metal trace MTL couples (electrically) the RWL transistor 422 to the product node PN in the CIM bit cell circuit 400(A). The metal trace MTL extends the distance $D_{RWL}$, which is less than four times (i.e., <4×) the gate pitch $P_{GATE}$ of the gates 436(1)-436(5), in the X-axis direction. The gate pitch $P_{GATE}$ is a center-to-center distance of the consecutive gates 436(1)-436(5) in the X-axis direction.

The P-type diffusion region 430P, the N-type diffusion region 430N, the memory bit cell circuit 406, the true pass-gate circuit 410T, the complement pass-gate circuit 410C, the RWL circuit 412, and the plurality of gates 436(1)-436(5) of a first one of the CIM bit cell circuits 400(A)-400(D) on one side (e.g., left side) of the line $LY_{400}$ (e.g., in the CIM bit cell circuit 400(A)) mirror the P-type diffusion region 430P, the N-type diffusion region 430N, the memory bit cell circuit 406, the true pass-gate circuit 410T, the complement pass-gate circuit 410C, the RWL circuit 412, and the plurality of gates 436(1)-436(5) of a second one of the CIM bit cell circuits 400(A)-400(D) on another side (e.g., right side) of the line $LY_{400}$ (e.g., in the CIM bit cell circuit 400(B)).

Due to the symmetry of the orientations OA-OD, the metal trace MTL extends the distance $D_{RWL}$ in each of the CIM bit cell circuits 400(A)-400(D). Resistance of the metal trace MTL is based on the distance $D_{RWL}$ in each of the CIM bit cell circuits 400(A)-400(D). As a result of such symmetry, variation of a current $ID_{RWL}$ in the metal trace MTL, between the product node PN and the RWL transistor 422 to reset/initialize the product node PN, is minimized among the CIM bit cell circuits 400(A)-400(D). Therefore, variation of a reset/initialization time of the product nodes PN is minimized among the CIM bit cell circuits 400(A)-400(D). Minimizing variations of a reset/initialization time provides a faster, more reliable reset/initialization operation. Consistency of reset/initialization timing among the CIM bit cell circuits 400(A)-400(D) in FIG. 4A is contrasted below to a conventional physical layout 600 of a sub-array circuit 500 of the CIM bit cell circuits 300 of FIG. 3, with reference to FIGS. 5 and 6.

Figure 5:
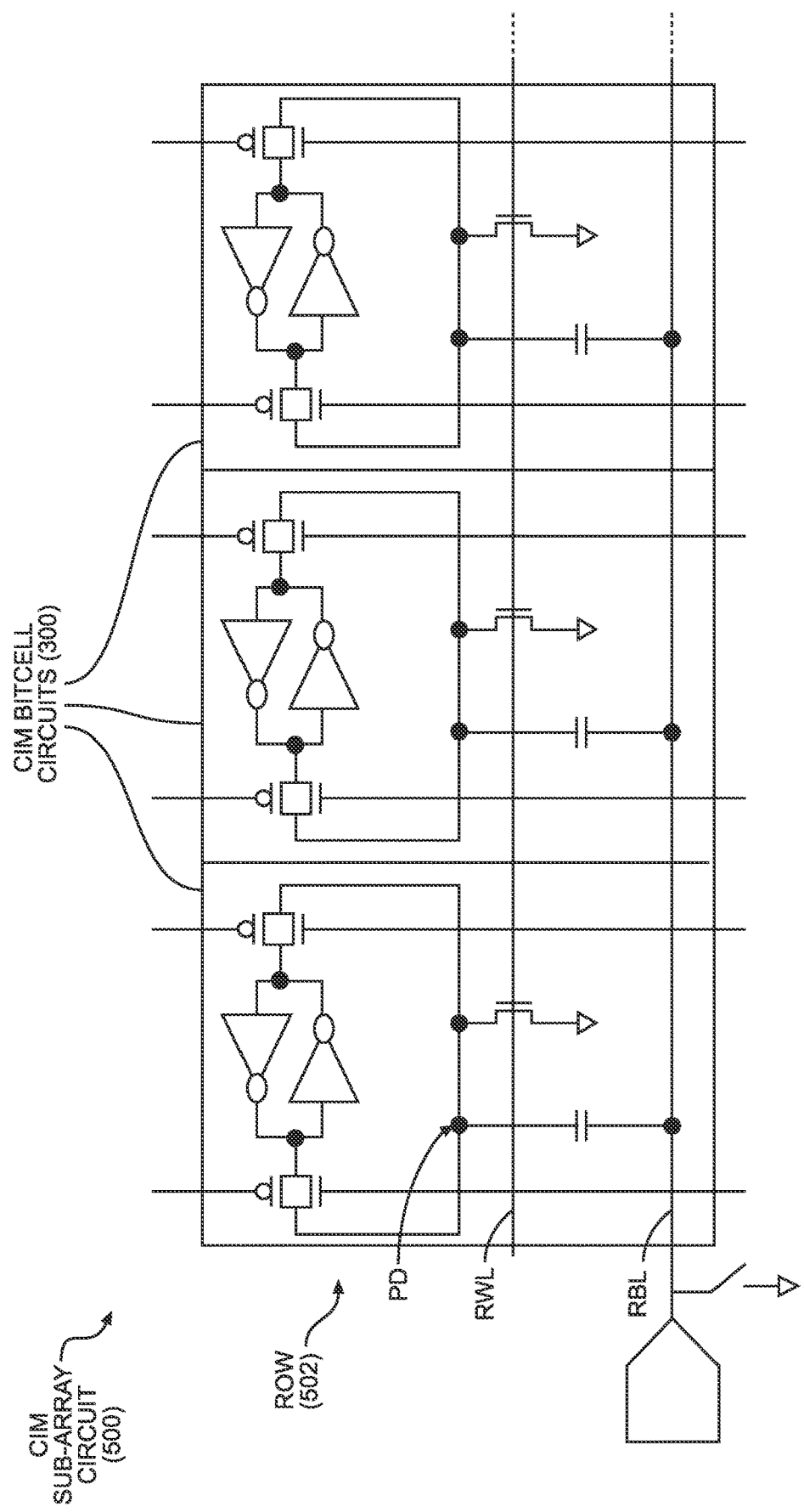
FIG. 5 is a schematic diagram of three (3) CIM bit cell circuits each for storing a true weight data and a complement weight data and generating an XNOR product data based on an activation input data.

FIG. 5 is a schematic diagram illustrating an example of a CIM sub-array circuit 500 including a row 502 of three (3) of the CIM bit cell circuits 300 in FIG. 3 coupled to a read bit line RBL. The product data PD of each of the respective CIM bit cell circuits 300 is accumulated on the read bit line RBL in a MAC operation. The CIM sub-array circuit 500 is an example showing how a plurality of the CIM bit cell circuits 300 are interconnected in an array (not shown). FIG. 5 is provided to show that, in addition to the read bit line RBL being coupled to all of the CIM bit cell circuits 300, the read word line RWL is also coupled to all of the CIM bit cell circuits 300 in the sub-array circuit 500 to allow the CIM bit cell circuits 300 in the row 502 to be reset/initialized by activation of the read word line RWL in combination with the activation data AD controlling the true and complement pass-gate circuits 320T and 320C.

Figure 6:
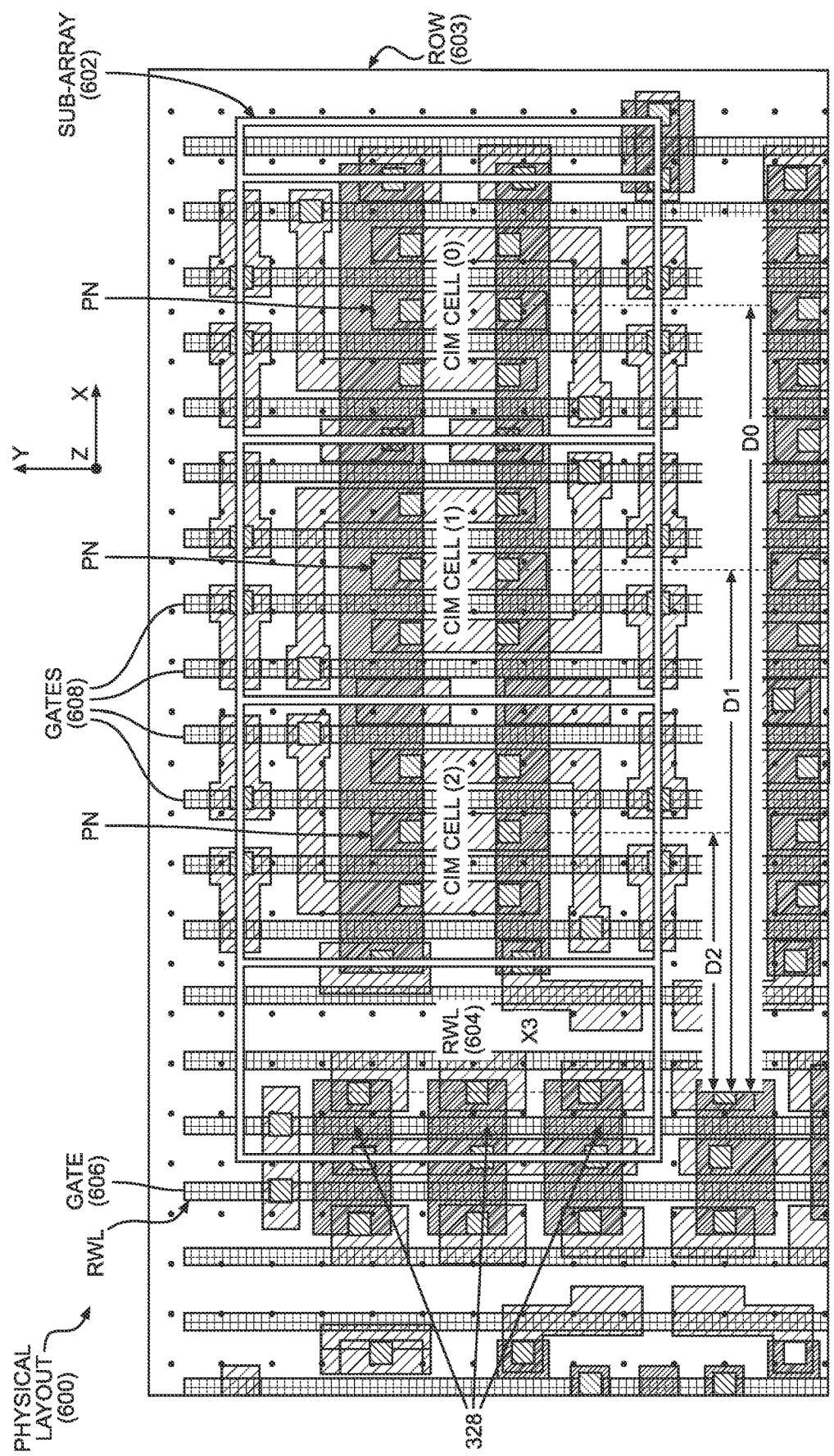
FIG. 6 is a top view of a set of three (3) CIM bit cell circuits each configured to perform a MAC operation corresponding to the neural network node in FIG. 1 and a cluster of three (3) RWL transistors corresponding to the three (3) CIM bit cell circuits in a conventional CIM bit cell array circuit.

FIG. 6 is a top plan view of a physical layout 600 of a sub-array 602 corresponding to the CIM sub-array circuit 500 in FIG. 5. In FIG. 6, the sub-array 602 includes CIM CELL(0), CIM CELL(1), and CIM CELL(2) disposed in a row 603 in the X-axis direction. The sub-array 602 also includes an RWL circuit 604. Features of the CIM CELL (0)-CIM CELL(2) and the RWL circuit 604 corresponding to those of the CIM bit cell circuits 300 in FIG. 3 are referred to by the same labels in FIG. 6 as used in FIG. 3. Each of the CIM CELL(0)-CIM CELL(2) are similar to the CIM bit cell circuits 300 shown in FIG. 3. However, the RWL transistors 328 of the CIM CELL(0)-CIM CELL(2) are separated from the CIM CELL(0)-CIM CELL(2) and grouped together in the RWL circuit 604 because the RWL transistors 328 are controlled by the read word line RWL provided on a same gate 606. The RWL transistors 328 are disposed in the Y-axis direction, which is the direction gates 608 are disposed in the physical layout 600, so the gate 606 can control all the RWL transistors 328. Furthermore, a plurality of the sub-arrays 602 disposed in the Y-axis direction in a larger array (not shown) would have the RWL circuits 604 aligned, such that their respective RWL transistors 328 could be activated together by the same gate 606.

Although the physical layout 600 including the RWL circuit 604 may simplify routing the read word line RWL to the RWL transistors 328 of each of the CIM CELL(0)-CIM CELL(2), such layout results in non-symmetric distances D0-D2 from the RWL circuit 604 to the CIM CELL(0)-CIM CELL(2). The distance D0 in the X-axis direction from the CIM CELL(0) to the RWL circuit 604 is greater than the distance D1 from the CIM CELL(1) to the RWL circuit 604, and the distance D1 from the CIM CELL(1) to the RWL circuit 604 is greater than the distance D2 from the CIM CELL(2) to the RWL circuit 604. The distances D0-D2 determine the lengths of metal traces (not shown) used to couple the CIM CELL(0)-CIM CELL(2) to the RWL circuit 604 to provide current paths for resetting/initializing the respective product nodes PN. Resistance of a metal trace depends on length, and a current in a metal trace decreases with increased resistance. Thus, due to the greater distance D0, the CIM CELL(0) would have a smaller reset/initialization current than the CIM CELL(2), resulting in a longer reset/initialization time. Thus, a time to reset/initialize all the CIM bit cell circuits 300 in the sub-array 602 is delayed by the CIM CELL(2), which reduces performance of the processor. If the CIM CELL(0) is not allowed sufficient time to reset/initialize, a reset/initialize operation may be unreliable.

Thus, although the physical layout 600, with RWL circuit 604 being separate from the CIM CELL(0)-CIM CELL(2), allows an efficient placement of the RWL transistors 328 and a gate 606, performance and reliability of the reset/initialization operation suffer in the physical layout 600. The CIM array 402 in FIG. 4A incorporates the RWL circuits 412 and provides higher performance and reliability than a conventional array having the physical layout 600 in FIG. 6.

Figure 7:
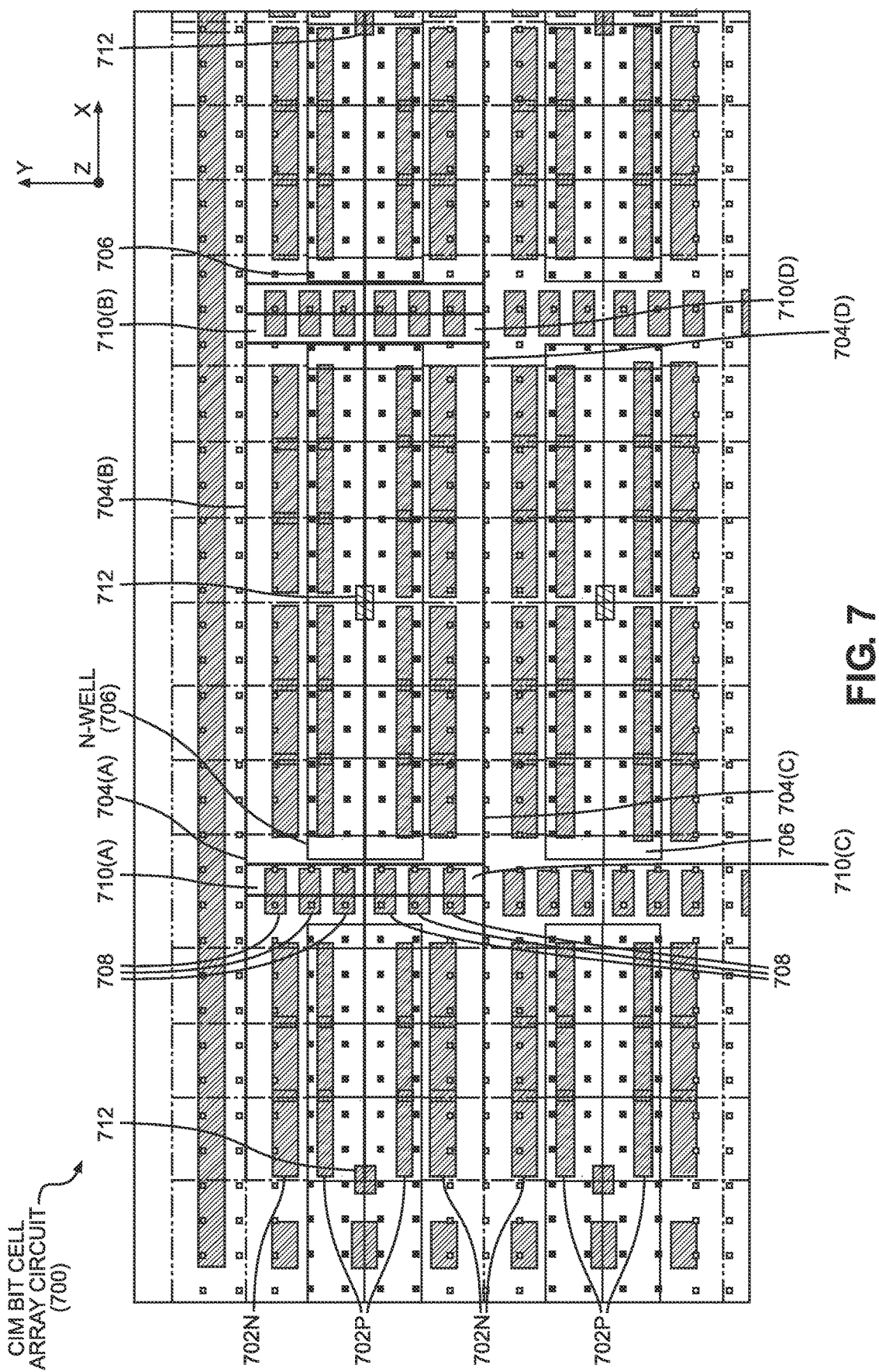
FIG. 7 is a layout top view of N-well regions including P-type diffusion regions and P-well regions including N-type diffusion regions disposed in a semiconductor substrate in the sub-array of CIM bit cell circuits in FIG. 5, the N-well regions limited to a distance corresponding to six (6) CIM bit cell circuits.

FIG. 7 is a layout top view of a CIM bit cell array circuit 700 based on the conventional physical layout 600 in FIG. 6. The layout top view in FIG. 7 illustrates P-type diffusion regions 702P and N-type diffusion regions 702N of sub-arrays 704(A)-704(D) that each correspond to the sub-array 602 of FIG. 6. The P-type diffusion regions 702P are formed in N-wells 706 that extend in the X-axis direction. Also shown in FIG. 7 are N-type diffusion regions 708 for RWL circuits 710(A)-710(D) that correspond to the RWL circuits 604 in FIG. 6. The RWL circuits 710(A)-710(D) are associated with respective ones of the sub-arrays 704(A)-704 (D). The N-wells 706 are disposed in the X-axis direction but the N-type diffusion regions 708 in the RWL circuits 710(A)-710(D) are disposed in the Y-axis direction to correspond to a direction of a gate 606 (not shown). By positioning the RWL circuit 710(A) on a left end of sub-array 704(A), and the RWL circuit 710(B) on the right end of the sub-array 704(B), one N-well 706 can extend through both of the sub-arrays 704(A) and 704(B). Similarly, one N-well 706 extends through both of the sub-arrays 704(C) and 704(D). Due to the N-type diffusion regions 708, the N-wells 706 cannot extend in the X-axis direction farther than two sub-arrays 704 each including the CELL(0)-CIM CELL(2) or a total of six (6) CIM CELLS in the X-axis direction. N-well ties 712 are, therefore, placed every two (2) sub-arrays 704 in the X-axis direction.

Figure 8:
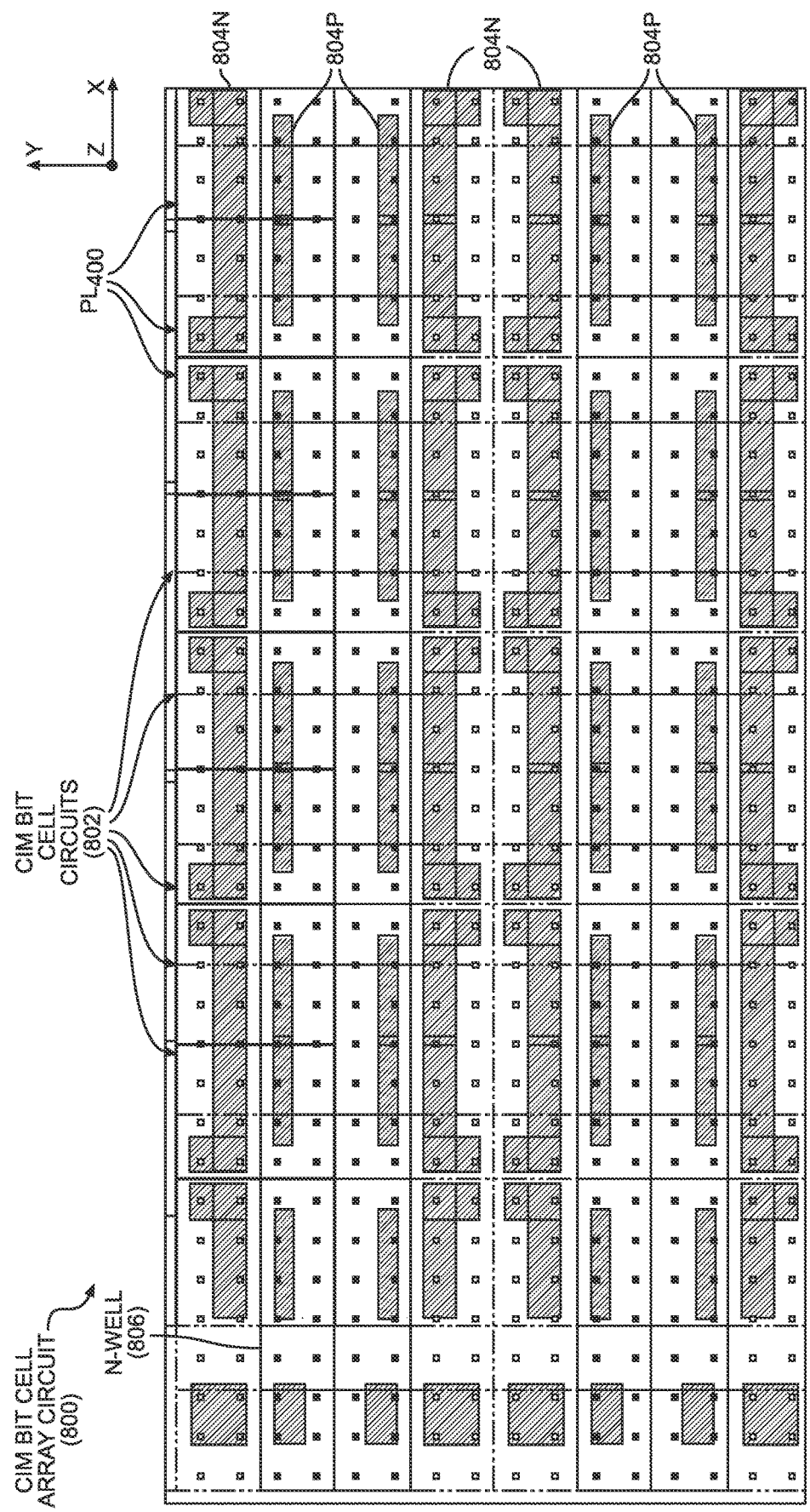
FIG. 8 is a top view of N-well regions including P-type diffusion regions and P-well regions including N-type diffusion regions disposed in a semiconductor substrate according to the CIM bit cell array circuit in FIG. 4A, the N-well regions extending a distance in a first axis direction corresponding to at least seven (7) CIM bit cell circuits.

In contrast to FIG. 7, FIG. 8 is a layout top view of an exemplary CIM bit cell array circuit 800 of CIM bit cell circuits 802 based on the exemplary CIM bit cell circuits 400(A)-400(D) in FIG. 4A. The layout top view in FIG. 8 illustrates P-type diffusion regions 804P and N-type diffusion regions 804N corresponding to the P-type and N-type diffusion regions 430P and 430N, respectively, in the CIM array 402 in FIG. 4A. As discussed above with regard to FIGS. 4A and 4B, the RWL circuit 412 is incorporated into the CIM cell layout $PL_{400}$ by including the RWL transistor 422 into the N-type diffusion region 430N with the true pull-down transistor 418T, the complement pull-down transistor 418C, the second true transistor 426N, and the second complement transistor 428N. Thus, N-well 806 continues uninterrupted in the X-axis direction through a plurality of consecutive CIM bit cell circuits 802. In this regard, the N-well 806 includes the P-type diffusion regions 430P of seven (7) or more of the CIM bit cell circuits 400 disposed consecutively in the X-axis direction.

Figure 9:
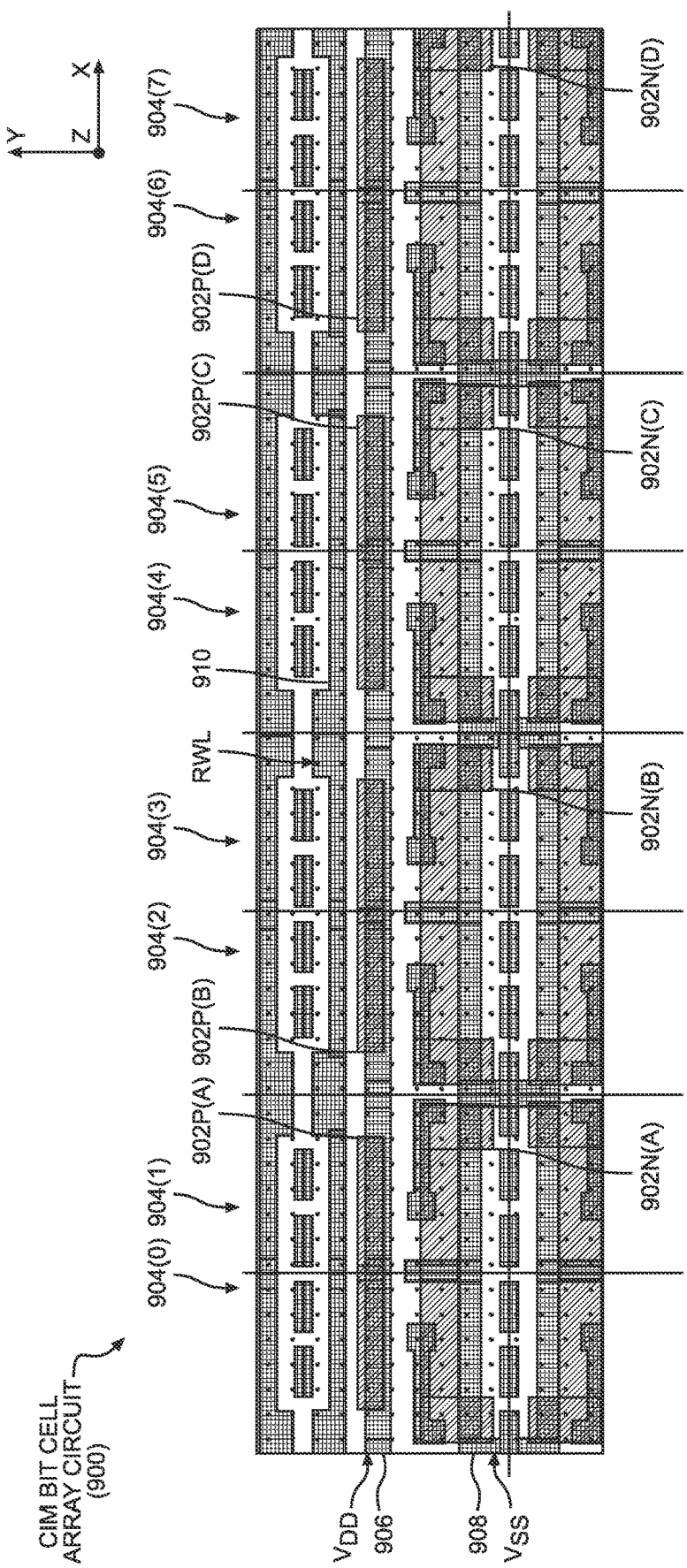
FIG. 9 is a timing diagram illustrating P-type diffusion regions of CIM bit cell circuits disposed in a semiconductor substrate in an array corresponding to FIG. 4A and including metal traces for providing a supply voltage and a ground voltage to at least seven (7) consecutive CIM bit cell circuits disposed in a first axis direction.

FIG. 9 is a layout top view illustrating another view of an exemplary CIM bit cell array circuit 900 corresponding to the CIM bit cell array 800 in FIG. 8. FIG. 9 shows P-type diffusion regions 902P(A)-902P(D), in a plurality of CIM bit cell circuits 904(0)-904(7), that each correspond to the CIM bit cell circuits 400(A)-400(D) in the CIM array 402 in FIG. 4A. FIG. 9 also shows N-type diffusion regions 902N(A)-902N(D) in the CIM bit cell circuits 904(0)-904(7). In contrast to FIG. 8, in which the N-well 806 is shown, FIG. 9 shows metal trace 906 coupled to the supply voltage rail (not shown) for providing the supply voltage $V_{DD}$ to the CIM bit cell circuits 904(0)-904(7) disposed in an X-axis direction. FIG. 9 also shows metal trace 908 disposed in an X-axis direction and coupled to the ground voltage rail (not shown) for providing the ground voltage $V_{SS}$ to the CIM bit cell circuits 904(0)-904(7). FIG. 9 also shows metal trace 910 disposed in an X-axis direction for providing the read word line RWL to the CIM bit cell circuits 904(0)-904(7).

With the RWL circuits 412 disposed within each of the CIM bit cell circuit 904(0)-904(7), rather than disposed in RWL circuits 604 in FIG. 6, the metal traces 906, 908, and 910 may extend uninterrupted for more than six (6) of the CIM bit cell circuits 904(0)-904(7). Thus, the metal trace 906 is coupled to at least seven (7) of the CIM bit cell circuits 904(0)-904(7) disposed consecutively in the X-axis direction and is configured to provide the supply voltage $V_{DD}$ to the at least seven (7) of the CIM bit cell circuits 904(0)-904(7). The metal trace 908 is also coupled to at least seven (7) of the CIM bit cell circuits 904(0)-904(7) disposed consecutively in the X-axis direction and is configured to provide the ground voltage $V_{SS}$ to the at least seven (7) of the CIM bit cell circuits 904(0)-904(7).

Figure 10A:
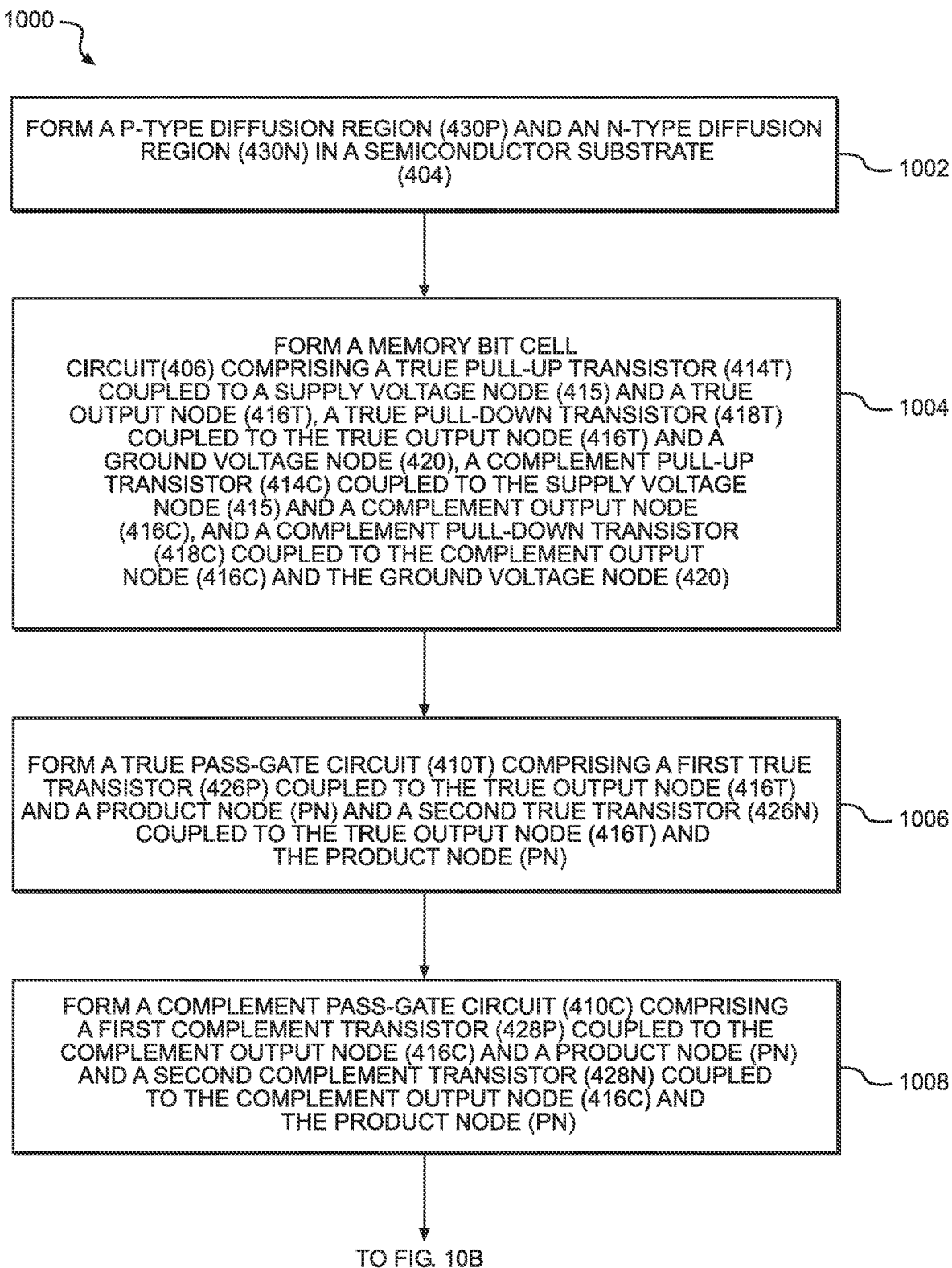
FIGS. 10A and 10B are a flowchart illustrating a method of fabricating the CIM bit cell array circuit in FIG. 4A.
Figure 10B:
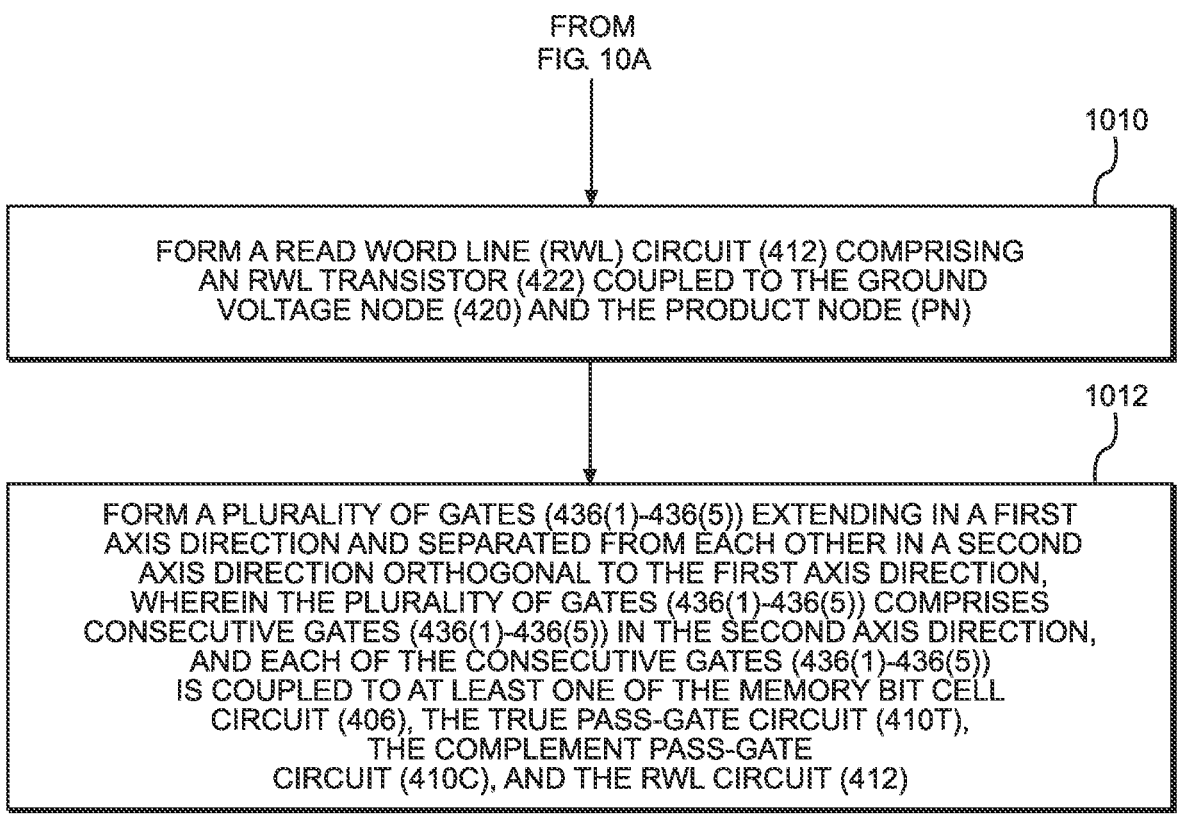

FIGS. 10A and 10B are a flowchart 1000 illustrating a method of fabricating a CIM bit cell array circuit 402 comprising a plurality of CIM bit cell circuits 400 on a semiconductor substrate 404. The method includes forming a P-type diffusion region 430P and an N-type diffusion region 430N in the semiconductor substrate 404 (block 1002). The method includes forming a memory bit cell circuit 406 comprising a true pull-up transistor 414T coupled to a supply voltage node 415 and a true output node 416T, a true pull-down transistor 418T coupled to the true output node 416T and a ground voltage node 420, a complement pull-up transistor 414C coupled to the supply voltage node 415 and a complement output node 416C, and a complement pull-down transistor 418C coupled to the complement output node 416C and the ground voltage node 420 (block 1004). The method comprises forming a true pass-gate circuit 410T comprising a first true transistor 426P coupled to the true output node 416T and the product node PN, and a second true transistor 426N coupled to the true output node 416T and the product node PN (block 1006). The method comprises forming a complement pass-gate circuit 410C comprising a first complement transistor 428P coupled to the complement output node 416C and the product node PN, and a second complement transistor 428N coupled to the complement output node 416C and the product node PN (block 1008). The method comprises forming an RWL circuit 412 comprising an RWL transistor 422 coupled to the ground voltage node 420 and the product node PN (block 1010). The method further comprises forming a plurality of gates 436(1)-436(5) extending in a first axis direction and separated from each other in a second axis direction orthogonal to the first axis direction, wherein the plurality of gates 436(1)-436(5) comprises consecutive gates 436(1)-436(5) in the second axis direction, and each of the consecutive gates 436(1)-436(5) is coupled to at least one of the memory bit cell circuit 406, the true pass-gate circuit 410T, the complement pass-gate circuit 410C, and the RWL circuit 412 (block 1012).

Figure 11:
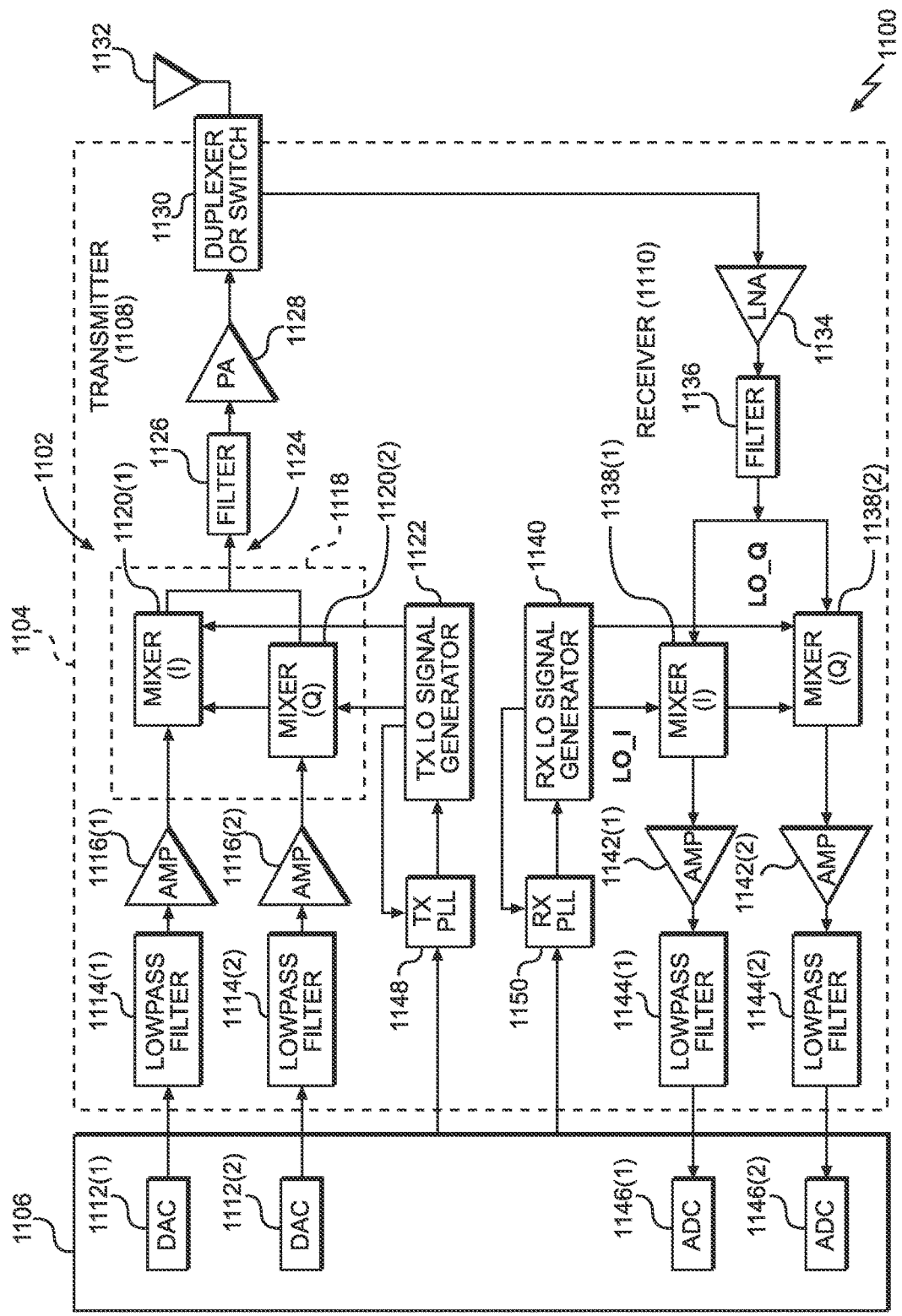
FIG. 11 is a block diagram of an exemplary wireless communications device that includes a radio frequency (RF) module including the CIM bit cell array circuit in FIG. 4A.

FIG. 11 illustrates an exemplary wireless communications device 1100 that includes radio frequency (RF) components formed from one or more integrated circuits (ICs) 1102, wherein any of the ICs 1102 can include an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8 and 9, and according to any of the aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RFICs, mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Downconversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Wireless communications devices 1100 that each include an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8, and 9, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
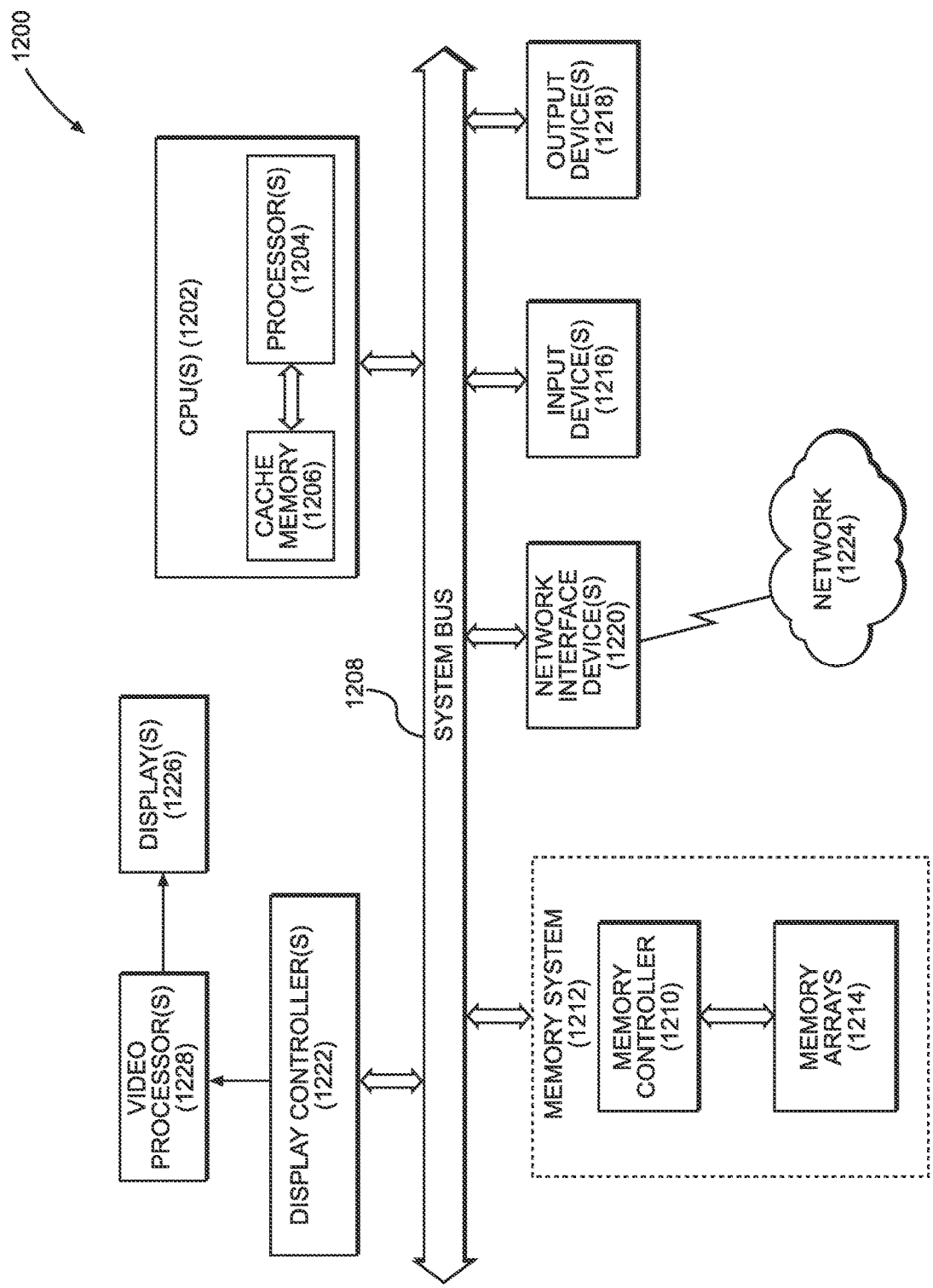
FIG. 12 is a block diagram of an exemplary integrated circuit (IC) package including an exemplary CIM array circuit including a CIM bit cell circuit including a memory circuit, a true pass-gate circuit, a complement pass-gate circuit, and an RWL circuit disposed in an orientation of a common CIM bit cell circuit layout for increased operation uniformity, as illustrated in FIG. 4A, and according to any of the aspects disclosed herein.

In this regard, FIG. 12 illustrates an example of a processor-based system 1200 including an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8, and 9, and according to any aspects disclosed herein. In this example, the processor-based system 1200 includes one or more central processor units (CPUs) 1202, which may also be referred to as CPU or processor cores, each including one or more processors 1204. The CPU(s) 1202 may have cache memory 1206 coupled to the processor(s) 1204 for rapid access to temporarily stored data. As an example, the processor(s) 1204 could include an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8, and 9, and according to any aspects disclosed herein. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212 that includes the memory controller 1210 and one or more memory arrays 1214, one or more input devices 1216, one or more output devices 1218, one or more network interface devices 1220, and one or more display controllers 1222, as examples. Each of the memory system 1212, the one or more input devices 1216, the one or more output devices 1218, the one or more network interface devices 1220, and the one or more display controllers 1222 can include an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8, and 9, and according to any of the aspects disclosed herein. The input device(s) 1216 can include any type of input device, including, but not limited to, input keys, switches, voice processors, etc. The output device(s) 1218 can include any type of output device, including, but not limited to, audio, video, other visual indicators, etc. The network interface device(s) 1220 can be any device configured to allow exchange of data to and from a network 1224. The network 1224 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1220 can be configured to support any type of communications protocol desired.

The CPU(s) 1202 may also be configured to access the display controller(s) 1222 over the system bus 1208 to control information sent to one or more displays 1226. The display controller(s) 1222 sends information to the display(s) 1226 to be displayed via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, a light emitting diode (LED) display, etc. The display controller(s) 1222, display(s) 1226, and/or the video processor(s) 1228 can include an exemplary CIM bit cell array circuit including CIM bit cell circuits each including a read word line circuit and each disposed in an orientation of a CIM bit cell circuit layout to increase uniformity for improved CIM bit cell array circuit performance and reliability, as illustrated in any of FIGS. 4A, 4B, 8, and 9, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A compute-in-memory (CIM) bit cell circuit, comprising:
    a memory bit cell circuit comprising:
        a true pull-up transistor coupled to a supply voltage rail and a true output node;
        a true pull-down transistor coupled to the true output node and a ground voltage rail;
        a complement pull-up transistor coupled to the supply voltage rail and a complement output node; and
        a complement pull-down transistor coupled to the complement output node and the ground voltage rail;
    a true pass-gate circuit comprising:
        a first true transistor coupled to the true output node and a product node; and
        a second true transistor coupled to the true output node and the product node;
    a complement pass-gate circuit comprising:
        a first complement transistor coupled to the complement output node and the product node; and
        a second complement transistor coupled to the complement output node and the product node;
    a read word line (RWL) circuit comprising an RWL transistor coupled to the ground voltage rail and the product node; and
    a plurality of gates extending in a first axis direction and separated from each other in a second axis direction orthogonal to the first axis direction;
    wherein the plurality of gates comprises consecutive gates in the second axis direction, each of the consecutive gates coupled to at least one of the memory bit cell circuit, the true pass-gate circuit, the complement pass-gate circuit, and the RWL circuit.

2. The CIM bit cell circuit of clause 1, wherein:
    each of the consecutive gates controls at least one of the memory bit cell circuit, the true pass-gate circuit, the complement pass-gate circuit, and the RWL circuit.

3. The CIM bit cell circuit of clause 1 or 2, wherein:
    each of the consecutive gates is coupled to at least one of the true pull-up transistor, the true pull-down transistor, the complement pull-up transistor, the complement pull-down transistor, the first true transistor, the second true transistor, the first complement transistor, the second complement transistor, and the RWL transistor.

4. The CIM bit cell circuit of clause 3, wherein:
    one of the plurality of gates coupled to the RWL transistor is a next consecutive gate to one of the plurality of gates coupled to the true pull-up transistor and the true pull-down transistor.

5. The CIM bit cell circuit of any one of clauses 1 to 4, wherein:
    the consecutive gates are separated from each other in the second axis direction according to a gate pitch; and
    a metal trace is coupled to the RWL transistor and the product node and extends less than four times the gate pitch in the second axis direction.

6. The CIM bit cell circuit of any one of clauses 1 to 5, wherein:
    the memory bit cell circuit is configured to store a true voltage corresponding to a true weight data on the true output node;
    at least one of the plurality of gates coupled to the true pass-gate circuit and at least one of the plurality of gates coupled to the complement pass-gate circuit receive a voltage based on an activation data; and
    a product voltage supplied to the product node corresponds to a not exclusive-OR (XNOR) of the true weight data and the activation data.

7. A compute-in-memory (CIM) bit cell circuit, comprising:
    a semiconductor substrate;
    a P-type diffusion region in the semiconductor substrate;
    an N-type diffusion region in the semiconductor substrate;
    a memory bit cell circuit comprising:
        a true pull-up transistor coupled to a supply voltage rail and a true output node;
        a true pull-down transistor coupled to a ground voltage rail and the true output node;
        a complement pull-up transistor coupled to the supply voltage rail and a complement output node; and
        a complement pull-down transistor coupled to the ground voltage rail and the complement output node;
    a true pass-gate circuit comprising:

a first true transistor coupled to the true output node and a product node; and
a second true transistor coupled to the true output node and the product node;
a complement pass-gate circuit comprising:
a first complement transistor coupled to the complement output node and the product node; and
a second complement transistor coupled to the complement output node and the product node; and
a read word line (RWL) transistor coupled to the product node and the ground voltage rail;
wherein the true pull-down transistor, the complement pull-down transistor, the first true transistor, the first complement transistor, and the RWL transistor each comprise a portion of the N-type diffusion region.

8. The CIM bit cell circuit of clause 7, wherein each of the true pull-up transistor, the complement pull-up transistor, the second true transistor, and the second complement transistor comprises a portion of the P-type diffusion region.

9. The CIM bit cell circuit of clause 7 or 8, wherein:
the memory bit cell circuit is configured to store a true voltage corresponding to a true weight data on the true output node;
at least one of the first true transistor and the second true transistor of the true pass-gate circuit and at least one of the first complement transistor and the second complement transistor of the complement pass-gate circuit receive a voltage based on an activation data; and
a product voltage supplied to the product node corresponds to a not exclusive-OR (XNOR) of the true weight data and the activation data.

10. A compute-in-memory (CIM) bit cell array circuit, comprising:
a semiconductor substrate; and
a plurality of CIM bit cell circuits on the semiconductor substrate, each of the plurality of CIM bit cell circuits comprising:
a P-type diffusion region disposed in the semiconductor substrate;
an N-type diffusion region disposed in the semiconductor substrate;
a memory bit cell circuit comprising:
a true pull-up transistor coupled to a supply voltage rail and a true output node;
a true pull-down transistor coupled to the true output node and a ground voltage rail;
a complement pull-up transistor coupled to the supply voltage rail and a complement output node; and
a complement pull-down transistor coupled to the complement output node and the ground voltage rail;
a true pass-gate circuit comprising:
a first true transistor coupled to the true output node and a product node; and
a second true transistor coupled to the true output node and the product node;
a complement pass-gate circuit comprising:
a first complement transistor coupled to the complement output node and the product node; and
a second complement transistor coupled to the complement output node and the product node;
a read word line (RWL) circuit comprising an RWL transistor coupled to the ground voltage rail and the product node; and
a plurality of gates extending in a first axis direction and separated from each other in a second axis direction orthogonal to the first axis direction;
wherein:
each of the memory bit cell circuit, the true pass-gate circuit, and the complement pass-gate circuit comprises at least one transistor disposed in the P-type diffusion region and at least one transistor disposed in the N-type diffusion region; and
the plurality of gates comprises consecutive gates in the second axis direction, each of the consecutive gates coupled to at least one of the memory bit cell circuit, the true pass-gate circuit, the complement pass-gate circuit, and the RWL circuit.

11. The CIM bit cell array circuit of clause 10, wherein in each of the plurality of CIM bit cell circuits:
the memory bit cell circuit is configured to store a true voltage corresponding to a true weight data on the true output node;
at least one of the plurality of gates coupled to the true pass-gate circuit and at least one of the plurality of gates coupled to the complement pass-gate circuit receive a voltage based on an activation data; and
a product voltage supplied to the product node corresponds to a not exclusive-OR (XNOR) of the true weight data and the activation data.

12. The CIM bit cell array circuit of clause 10 or 11, wherein:
a first one of the plurality of CIM bit cell circuits mirrors a second one of the plurality of CIM bit cell circuits on an opposite side of a first line extending in the second axis direction.

13. The CIM bit cell array circuit of clause 12, wherein:
the P-type diffusion region, the N-type diffusion region, the memory bit cell circuit, the true pass-gate circuit, the complement pass-gate circuit, the RWL circuit, and the plurality of gates of the first one of the plurality of CIM bit cell circuits on a first side of the first line mirror the P-type diffusion region, the N-type diffusion region, the memory bit cell circuit, the true pass-gate circuit, the complement pass-gate circuit, the RWL circuit, and the plurality of gates of the second one of the plurality of CIM bit cell circuits on a second side of the first line.

14. The CIM bit cell array circuit of clause 12 or 13, wherein:
a third one of the plurality of CIM bit cell circuits mirrors the second one of the plurality of CIM bit cell circuits on an opposite side of a second line extending in the first axis direction.

15. The CIM bit cell array circuit of any one of clauses 10 to 14, further comprising a first metal trace, wherein the first metal trace is coupled to at least seven (7) of the plurality of CIM bit cell circuits disposed consecutively in the second axis direction and configured to provide a supply voltage.

16. The CIM bit cell array circuit of clause 15, further comprising a second metal trace, wherein the second metal trace is coupled to and configured to provide a ground voltage to the at least seven (7) of the plurality of CIM bit cell circuits.

17. The CIM bit cell array circuit of any one of clauses 10 to 16, wherein:
an N-well region comprises the P-type diffusion regions of at least seven (7) of the plurality of CIM bit cell circuits disposed consecutively in the second axis direction.

18. The CIM bit cell array circuit of any one of clauses 10 to 17, integrated into a radio-frequency (RF) front end module.

19. The CIM bit cell array circuit of any one of clauses 10 to 17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A method of making a compute-in-memory (CIM) bit cell array circuit comprising a plurality of CIM bit cell circuits on a semiconductor substrate, the method comprising:
forming a P-type diffusion region and an N-type diffusion region in the semiconductor substrate;
forming a memory bit cell circuit comprising:
a true pull-up transistor coupled to a supply voltage rail and a true output node,
a true pull-down transistor coupled to the true output node and a ground voltage rail;
a complement pull-up transistor coupled to the supply voltage rail and a complement output node; and
a complement pull-down transistor coupled to the complement output node and the ground voltage rail;
forming a true pass-gate circuit comprising:
a first true transistor coupled to the true output node and a product node; and
a second true transistor coupled to the true output node and the product node;
forming a complement pass-gate circuit comprising:
a first complement transistor coupled to the complement output node and the product node; and
a second complement transistor coupled to the complement output node and the product node;
forming a read word line (RWL) circuit comprising an RWL transistor coupled to the ground voltage rail and the product node; and
forming a plurality of gates extending in a first axis direction and separated from each other in a second axis direction orthogonal to the first axis direction;
wherein the plurality of gates comprises consecutive gates in the second axis direction, and each of the consecutive gates is coupled to at least one of the memory bit cell circuit, the true pass-gate circuit, the complement pass-gate circuit, and the RWL circuit.

What is claimed is:

1. A compute-in-memory (CIM) bit cell circuit disposed in a layout on a semiconductor substrate, the CIM bit cell circuit comprising:
a memory bit cell circuit comprising:
a true pull-up transistor coupled to a supply voltage rail and a true output node;
a true pull-down transistor coupled to the true output node and a ground voltage rail;
a complement pull-up transistor coupled to the supply voltage rail and a complement output node; and
a complement pull-down transistor coupled to the complement output node and the ground voltage rail;
a true pass-gate circuit comprising:
a first true transistor coupled to the true output node and a product node; and
a second true transistor coupled to the true output node and the product node;
a complement pass-gate circuit comprising:
a first complement transistor coupled to the complement output node and the product node; and
a second complement transistor coupled to the complement output node and the product node;
a read word line (RWL) circuit comprising an RWL transistor coupled to the ground voltage rail and the product node; and
a plurality of gates extending in a first axis direction and separated from each other in a second axis direction orthogonal to the first axis direction, each gate of the plurality of gates disposed on the semiconductor substrate;
wherein the plurality of gates comprises consecutive gates directly coupled, in consecutive order in the second axis direction, to the RWL transistor, the true pull-up transistor, a first one of the first true transistor and the first complement transistor, a second one of the first true transistor and the first complement transistor, and the complement pull-up transistor.

2. The CIM bit cell circuit of claim 1, wherein:
each of the consecutive gates controls at least one of the memory bit cell circuit, the true pass-gate circuit, the complement pass-gate circuit, and the RWL circuit.

3. The CIM bit cell circuit of claim 1, wherein:
each of the consecutive gates is directly coupled to at least one of the true pull-up transistor, the true pull-down transistor, the complement pull-up transistor, the complement pull-down transistor, the first true transistor, the second true transistor, the first complement transistor, the second complement transistor, and the RWL transistor.

4. The CIM bit cell circuit of claim 1, wherein:
the consecutive gates are separated from each other in the second axis direction according to a gate pitch; and
a metal trace is coupled to the RWL transistor and the product node and extends less than four times the gate pitch in the second axis direction.

5. The CIM bit cell circuit of claim 1, wherein:
the memory bit cell circuit is configured to store a true voltage corresponding to a true weight data on the true output node;
at least one of the plurality of gates coupled to the true pass-gate circuit and at least one of the plurality of gates coupled to the complement pass-gate circuit receive a voltage based on an activation data; and
a product voltage supplied to the product node corresponds to a not exclusive-OR (XNOR) of the true weight data and the activation data.

6. A compute-in-memory (CIM) bit cell circuit disposed in a layout on a semiconductor substrate, the CIM bit cell circuit comprising:
the semiconductor substrate;
a P-type diffusion region in the semiconductor substrate;
an N-type diffusion region in the semiconductor substrate;
a memory bit cell circuit comprising:
a true pull-up transistor coupled to a supply voltage rail and a true output node;
a true pull-down transistor coupled to a ground voltage rail and the true output node;

a complement pull-up transistor coupled to the supply voltage rail and a complement output node; and
a complement pull-down transistor coupled to the ground voltage rail and the complement output node;
a true pass-gate circuit comprising:
a first true transistor coupled to the true output node and a product node; and
a second true transistor coupled to the true output node and the product node;
a complement pass-gate circuit comprising:
a first complement transistor coupled to the complement output node and the product node; and
a second complement transistor coupled to the complement output node and the product node; and
a read word line (RWL) transistor coupled to the product node and the ground voltage rail;
wherein the N-type diffusion region comprises portions, disposed consecutively in order, of the RWL transistor, the true pull-down transistor, the first true transistor, the first complement transistor, and the complement pull-down transistor.

7. The CIM bit cell circuit of claim 6, wherein each of the true pull-up transistor, the complement pull-up transistor, the second true transistor, and the second complement transistor comprises a portion of the P-type diffusion region.

8. The CIM bit cell circuit of claim 6, wherein:
the memory bit cell circuit is configured to store a true voltage corresponding to a true weight data on the true output node;
at least one of the first true transistor and the second true transistor of the true pass-gate circuit and at least one of the first complement transistor and the second complement transistor of the complement pass-gate circuit receive a voltage based on an activation data; and
a product voltage supplied to the product node corresponds to a not exclusive-OR (XNOR) of the true weight data and the activation data.

9. A compute-in-memory (CIM) bit cell array circuit, comprising:
a semiconductor substrate; and
a plurality of CIM bit cell circuits disposed in a layout on the semiconductor substrate, each of the plurality of CIM bit cell circuits comprising:
a P-type diffusion region disposed in the semiconductor substrate;
an N-type diffusion region disposed in the semiconductor substrate;
a memory bit cell circuit comprising:
a true pull-up transistor coupled to a supply voltage rail and a true output node;
a true pull-down transistor coupled to the true output node and a ground voltage rail;
a complement pull-up transistor coupled to the supply voltage rail and a complement output node; and
a complement pull-down transistor coupled to the complement output node and the ground voltage rail;
a true pass-gate circuit comprising:
a first true transistor coupled to the true output node and a product node; and
a second true transistor coupled to the true output node and the product node;
a complement pass-gate circuit comprising:
a first complement transistor coupled to the complement output node and the product node; and
a second complement transistor coupled to the complement output node and the product node;
a read word line (RWL) circuit comprising an RWL transistor coupled to the ground voltage rail and the product node; and
a plurality of gates extending in a first axis direction and separated from each other in a second axis direction orthogonal to the first axis direction;
wherein:
disposed in order in the second axis direction, the RWL circuit, the true pass-gate circuit, the memory bit cell circuit, and the complement pass-gate circuit each comprise at least one transistor disposed in the P-type diffusion region and at least one transistor disposed in the N-type diffusion region; and
the plurality of gates comprises consecutive gates in the second axis direction coupled to the memory bit cell circuit, the true pass-gate circuit, the complement pass-gate circuit, and the RWL circuit.

10. The CIM bit cell array circuit of claim 9, wherein in each of the plurality of CIM bit cell circuits:
the memory bit cell circuit is configured to store a true voltage corresponding to a true weight data on the true output node;
at least one of the plurality of gates coupled to the true pass-gate circuit and at least one of the plurality of gates coupled to the complement pass-gate circuit receive a voltage based on an activation data; and
a product voltage supplied to the product node corresponds to a not exclusive-OR (XNOR) of the true weight data and the activation data.

11. The CIM bit cell array circuit of claim 9, wherein:
a first one of the plurality of CIM bit cell circuits mirrors a second one of the plurality of CIM bit cell circuits on an opposite side of a first line extending in the second axis direction.

12. The CIM bit cell array circuit of claim 11, wherein:
the P-type diffusion region, the N-type diffusion region, the memory bit cell circuit, the true pass-gate circuit, the complement pass-gate circuit, the RWL circuit, and the plurality of gates of the first one of the plurality of CIM bit cell circuits on a first side of the first line mirror the P-type diffusion region, the N-type diffusion region, the memory bit cell circuit, the true pass-gate circuit, the complement pass-gate circuit, the RWL circuit, and the plurality of gates of the second one of the plurality of CIM bit cell circuits on a second side of the first line.

13. The CIM bit cell array circuit of claim 11, wherein:
a third one of the plurality of CIM bit cell circuits mirrors the second one of the plurality of CIM bit cell circuits on an opposite side of a second line extending in the first axis direction.

14. The CIM bit cell array circuit of claim 9, further comprising a first metal trace, wherein the first metal trace is coupled to at least seven (7) of the plurality of CIM bit cell circuits disposed consecutively in the second axis direction and configured to provide a supply voltage.

15. The CIM bit cell array circuit of claim 14, further comprising a second metal trace, wherein the second metal trace is coupled to and configured to provide a ground voltage to the at least seven (7) of the plurality of CIM bit cell circuits.

16. The CIM bit cell array circuit of claim 9, wherein:
an N-well region comprises the P-type diffusion regions of at least seven (7) of the plurality of CIM bit cell circuits disposed consecutively in the second axis direction.

17. The CIM bit cell array circuit of claim 9, integrated into a radio-frequency (RF) front end module.

18. The CIM bit cell array circuit of claim 9 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A method of making a compute-in-memory (CIM) bit cell array circuit comprising a plurality of CIM bit cell circuits in a layout on a semiconductor substrate, the method comprising:
forming a P-type diffusion region and an N-type diffusion region in the semiconductor substrate;
forming a memory bit cell circuit comprising:
a true pull-up transistor coupled to a supply voltage rail and a true output node;
a true pull-down transistor coupled to the true output node and a ground voltage rail;
a complement pull-up transistor coupled to the supply voltage rail and a complement output node; and
a complement pull-down transistor coupled to the complement output node and the ground voltage rail;
forming a true pass-gate circuit comprising:
a first true transistor coupled to the true output node and a product node; and
a second true transistor coupled to the true output node and the product node;
forming a complement pass-gate circuit comprising:
a first complement transistor coupled to the complement output node and the product node; and
a second complement transistor coupled to the complement output node and the product node;
forming a read word line (RWL) circuit comprising an RWL transistor coupled to the ground voltage rail and the product node; and
forming a plurality of gates extending in a first axis direction and separated from each other in a second axis direction orthogonal to the first axis direction, each gate of the plurality of gates disposed on the semiconductor substrate;
wherein the plurality of gates comprises consecutive gates directly coupled, in consecutive order in the second axis direction, to the RWL transistor, the true pull-up transistor, a first one of the first true transistor and the first complement transistor, a second one of the first true transistor and the first complement transistor, and the complement pull-up transistor.

* * * * *